United States Patent
Choi et al.

(10) Patent No.: US 12,217,807 B2
(45) Date of Patent: Feb. 4, 2025

(54) NON-VOLATILE MEMORY DEVICE AND PROGRAMMING METHOD THEREOF

(71) Applicant: SAMSUNG ELECTRONICS CO., LTD., Suwon-si (KR)

(72) Inventors: Yonghyuk Choi, Suwon-si (KR); Yohan Lee, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 192 days.

(21) Appl. No.: 17/960,346

(22) Filed: Oct. 5, 2022

(65) Prior Publication Data

US 2023/0162807 A1 May 25, 2023

(30) Foreign Application Priority Data

Nov. 23, 2021 (KR) ........................ 10-2021-0162599

(51) Int. Cl.
 G11C 7/22 (2006.01)
 G11C 16/04 (2006.01)
 G11C 16/10 (2006.01)
 G11C 16/34 (2006.01)
 G11C 11/56 (2006.01)

(52) U.S. Cl.
 CPC ...... *G11C 16/3427* (2013.01); *G11C 16/0483* (2013.01); *G11C 16/10* (2013.01); *G11C 16/3459* (2013.01); *G11C 11/5628* (2013.01)

(58) Field of Classification Search
 CPC . G11C 16/3427; G11C 16/0483; G11C 16/10; G11C 16/3459; G11C 16/08; G11C 11/5628
 See application file for complete search history.

(56) References Cited

U.S. PATENT DOCUMENTS

| 8,174,902 | B2 | 5/2012 | Lee et al. |
| 8,493,789 | B2 | 7/2013 | Yoon et al. |
| 9,508,441 | B1 * | 11/2016 | Nam ................ G11C 16/0483 |
| 9,984,761 | B2 | 5/2018 | Maejima et al. |
| 10,424,369 | B2 | 9/2019 | Harada |
| 10,741,262 | B2 | 8/2020 | Lin et al. |

(Continued)

FOREIGN PATENT DOCUMENTS

| JP | 2017-111847 A | 6/2017 |
| KR | 10-1463584 B1 | 11/2014 |

(Continued)

*Primary Examiner* — Mushfique Siddique

(74) *Attorney, Agent, or Firm* — Sughrue Mion, PLLC

(57) ABSTRACT

An operating method of a non-volatile memory device that includes a plurality of cell strings each including a first stack and a second stack adjacent to the first stack, the operating method include performing a first program operation during a time period in which a plurality of program loops are performed, by applying a program voltage including a first plurality of voltage levels to a select word line connected to the first stack of each of the plurality of cell strings, applying, during the time period, second voltages including a second plurality of voltage levels to a non-select word line connected to the first stack of each of the plurality of cell strings, and maintaining, during the time period, a third voltage at a first level, the third voltage applied to a non-select word line connected to the second stack of each of the plurality of cell strings.

19 Claims, 20 Drawing Sheets

(56) References Cited

U.S. PATENT DOCUMENTS

| | | | |
|---|---|---|---|
| 10,847,228 B2 | 11/2020 | Lee | |
| 2009/0180317 A1* | 7/2009 | Kang | G11C 16/0483 |
| | | | 365/185.18 |
| 2015/0294726 A1 | 10/2015 | Sim et al. | |
| 2020/0143890 A1* | 5/2020 | Lee | G11C 11/5628 |
| 2021/0158871 A1 | 5/2021 | Shin et al. | |
| 2023/0145681 A1* | 5/2023 | Sungmin | G11C 16/10 |
| | | | 365/189.011 |
| 2023/0162807 A1* | 5/2023 | Choi | G11C 16/3427 |
| | | | 365/185.02 |

FOREIGN PATENT DOCUMENTS

| | | |
|---|---|---|
| KR | 10-2015-0117152 A | 10/2015 |
| KR | 10-1682666 B1 | 12/2016 |
| KR | 10-2021-0062502 A | 5/2021 |

* cited by examiner

NON-VOLATILE MEMORY DEVICE AND PROGRAMMING METHOD THEREOF

CROSS-REFERENCE TO RELATED APPLICATION

This application is based on and claims priority under 35 U.S.C. § 119 to Korean Patent Application No. 10-2021-0162599, filed on Nov. 23, 2021, in the Korean Intellectual Property Office, the disclosure of which is incorporated by reference herein in its entirety.

BACKGROUND

1. Field

The disclosure relates generally to a non-volatile memory device, and more particularly, to a non-volatile memory device of which boosting efficiency is increased by using a center dummy line transistor in a multi-stack structure, and a programming method thereof.

2. Description of Related Art

A semiconductor memory device is used to store data, and is classified into a volatile memory device and a non-volatile memory device. As an example of the non-volatile memory device, a flash memory device may be used in smartphones, personal computers (PCs), solid-state drives (SSDs), universal serial bus (USB) memory, digital cameras, mobile phones, tablet PCs, and other devices.

In a three-dimensional (3D) NAND flash memory having a multi-stack structure, dummy word lines exist between the multi-stacks. The dummy word line has not been used as a memory cell storing data due to process reasons or the like. Although the dummy word line occupies space in a flash memory, it is difficult to use the dummy word line to store data, and thus, the dummy word line is considered a wasted resource. There is a need to develop the performance of a flash memory by using a dummy word line As the number of highly-integrated vertical flash memory devices increases, a channel of a flash memory has lengthened. As the channel lengthens, the number of word lines involved in boosting increases, and thus, boosting efficiency is reduced.

SUMMARY

Provided are a memory device in which boosting efficiency is increased by using a center dummy line transistor, and a programming method thereof.

Additional aspects will be set forth in part in the description which follows and, in part, will be apparent from the description, or may be learned by practice of the presented embodiments.

According to an aspect of an example embodiment, An operating method of a non-volatile memory device that includes a plurality of cell strings each including a first stack and a second stack adjacent to the first stack, may include performing a first program operation during a time period in which a plurality of program loops are performed, by applying a program voltage including a first plurality of voltage levels to a select word line connected to the first stack of each of the plurality of cell strings, applying, during the time period, second voltages including a second plurality of voltage levels to a non-select word line connected to the first stack of each of the plurality of cell strings, and maintaining, during the time period, a third voltage at a first level, the third voltage applied to a non-select word line connected to the second stack of each of the plurality of cell strings.

According to an aspect of an example embodiment, an operating method of a non-volatile memory device including a plurality of cell strings connected to a plurality of bit lines, where the plurality of cell strings include a plurality of string select transistors respectively connected to the plurality of bit lines, may include applying a first voltage including a first level to a first bit line and a second bit line from among the plurality of bit lines during a first time period, applying a second voltage including a second level to the first bit line during a second time period subsequent to the first time period, turning on first string select transistors, from among the plurality of string select transistors, included in a cell string connected to the first bit line during the second time period, turning off second string select transistors, from among the plurality of string select transistors, included in a cell string connected to the second bit line during the second time period, and maintaining a third voltage applied to the second bit line at the second level during the second time period.

According to an aspect of an example embodiment, a non-volatile memory device may include a memory cell array including a plurality of cell strings, a voltage generator configured to generate a voltage applied to a bit line connected to the plurality of cell strings, and a control circuit configured to program data received from the outside to the memory cell array. The control circuit may be configured to control an electrical connection between a select stack including a select word line and a stack adjacent to the select stack by controlling at least one transistor adjacent to a boundary between the select stack and the stack adjacent to the select stack, and controlling a voltage applied to a non-select word line connected to the stack adjacent to the select stack to maintain a first level during a time period in which a plurality of program loops for the memory cell array are performed.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION OF THE EMBODIMENTS

Hereinafter, various embodiments of the disclosure are described with reference to the accompanying drawings.

Figure 1:
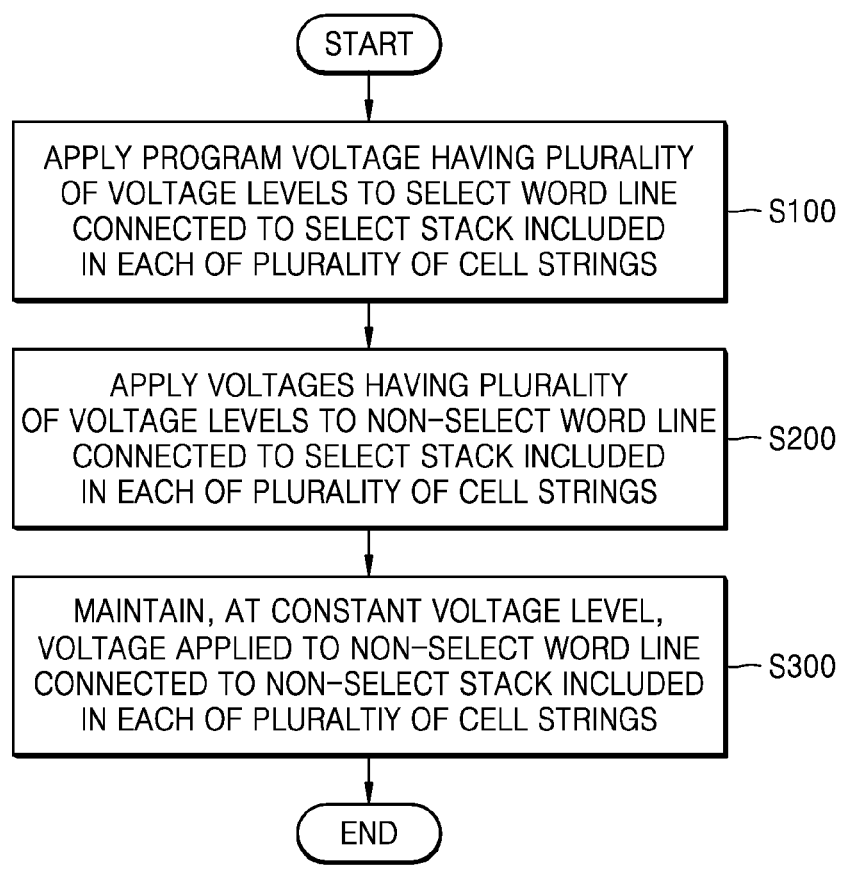
FIG. 1 is a flowchart of a programming method of a non-volatile memory device, according to an example embodiment.

FIG. 1 is a flowchart of a programming method of a non-volatile memory device, according to an example embodiment. The programming method of the non-volatile memory device may include a plurality of operations S100 to S300. In FIG. 1, a plurality of cell strings may include a select cell string and at least one non-select cell string, as described with reference to FIGS. 11A to 11C. The plurality of cell strings may be respectively arranged between a source line and a plurality of bit lines including a program enable bit line and at least one program prohibit bit line. Each of the cell strings may include a select stack including a select word line and non-select stacks not including a select word line.

The plurality of cell strings may be classified into two stacks as described with reference to FIGS. 9 to 12, and may be classified into three stacks as described with reference to FIGS. 14A to 14C.

In operation S100, during a time period in which a plurality of program loops are performed, a program operation may be performed by applying a program voltage having a plurality of voltage levels to a select word line connected to a select stack included in each of a plurality of cell strings. The plurality of voltage levels are voltage levels of a program voltage applied to a select word line as the program loops progress by incremental step pulse programming (ISPP), and may gradually increase.

In operation S200, during the time period, voltages having a plurality of voltage levels may be applied to a non-select word line connected to the select stack included in each of the plurality of cell strings. A pass voltage applied to the non-select word line may also be gradually increased as the program voltage increases so as to reduce a program voltage disturbance.

In operation S300, during the time period, a voltage applied to a non-select word line connected to a non-select stack included in each of the plurality of cell strings is maintained at a constant voltage level. By maintaining the voltage level constant, an amount of current consumed by the non-select stack may be reduced.

As a degree of integration of a flash memory increases, the number of stacks in which the flash memory is vertically stacked may increase, and a channel length of a cell string may increase. As the channel length increases, the number of word lines involved in boosting the channel increases, and pass voltage disturbance, which is a disturbance to memory cells connected to the non-select word line during programming, may increase. In addition, as the channel length increases, boosting efficiency decreases, and a program voltage disturbance, which is a disturbance to memory cells of the non-select cell string connected to the select word line, may increase.

The programming method of the non-volatile memory device according to embodiments of the disclosure may further include controlling an electrical connection between stacks of each of the cell strings by using a center dummy line transistor disposed on a boundary layer of the stacks. Through this operation, the center dummy line transistor functions similarly to a string select transistor, thereby reducing the number of word lines involved in boosting. Accordingly, boosting efficiency may be increased, pass voltage disturbance may be reduced, and a word line voltage of the non-select stack may be maintained constant from the start of a program to a recovery period in which the word line voltage is initialized. Therefore, the amount of current consumed by the non-select stack may be reduced.

Figure 2:
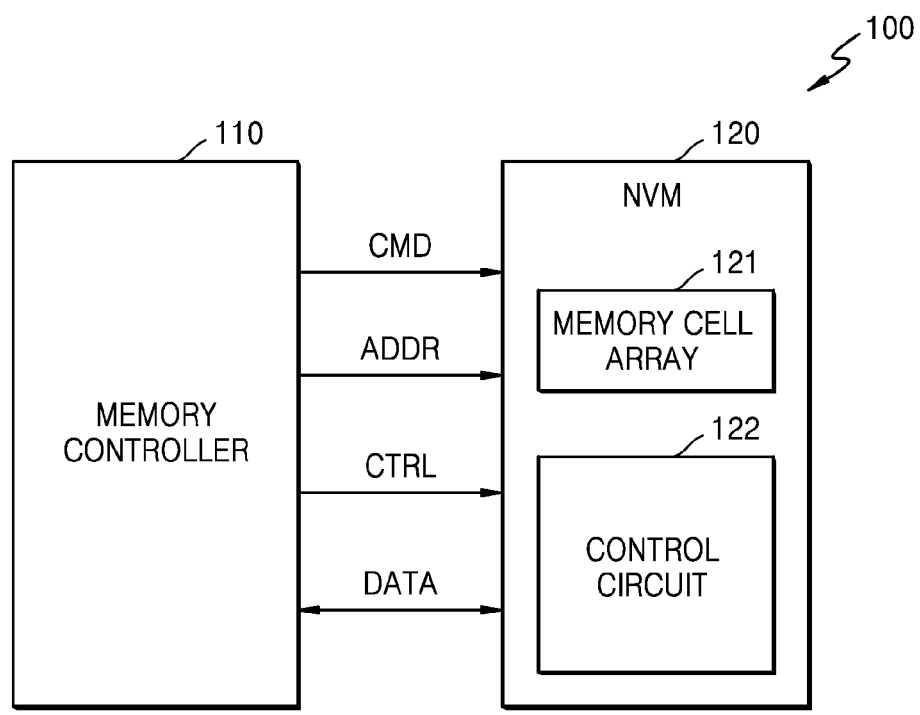
FIG. 2 is a block diagram of a memory system according to an example embodiment.

FIG. 2 is a block diagram of a memory system according to an example embodiment. Referring to FIG. 2, the memory system 100 may include a memory controller 110 and at least one memory device 120. The memory device 120 shown in FIG. 2 may be a non-volatile memory device, such as a flash memory device. The memory system 100 may include a data storage medium, such as a USB memory, a memory card, and a solid-state drive (SSD).

The memory device 120 may perform an erase, program, or read operation under the control by the memory controller 110. The memory device 120 may receive a command CMD and an address ADDR from the memory device 120 via an input/output line and transmit and receive data DATA for the program operation or the read operation to and from the memory controller 110. In addition, the memory device 120 may receive a control signal CTRL via a control line. The memory device 120 may include a memory cell array 121 and a control circuit 122.

The memory cell array 121 may include a plurality of memory blocks, and each of the plurality of memory blocks may include a plurality of memory cells. For example, the plurality of memory cells may be flash memory cells. Hereinafter, embodiments of the disclosure are described by taking a case in which the plurality of memory cells are NAND flash memory cells as an example. The memory cell array 121 may include a three-dimensional memory cell array including a plurality of cell strings, which is described below with reference to FIGS. 4 and 5.

The control circuit 122 may perform an operation of initializing channels for the plurality of cell strings in the memory cell array 121 and perform a program operation on a select memory cell from among the plurality of memory cells.

Figure 3:
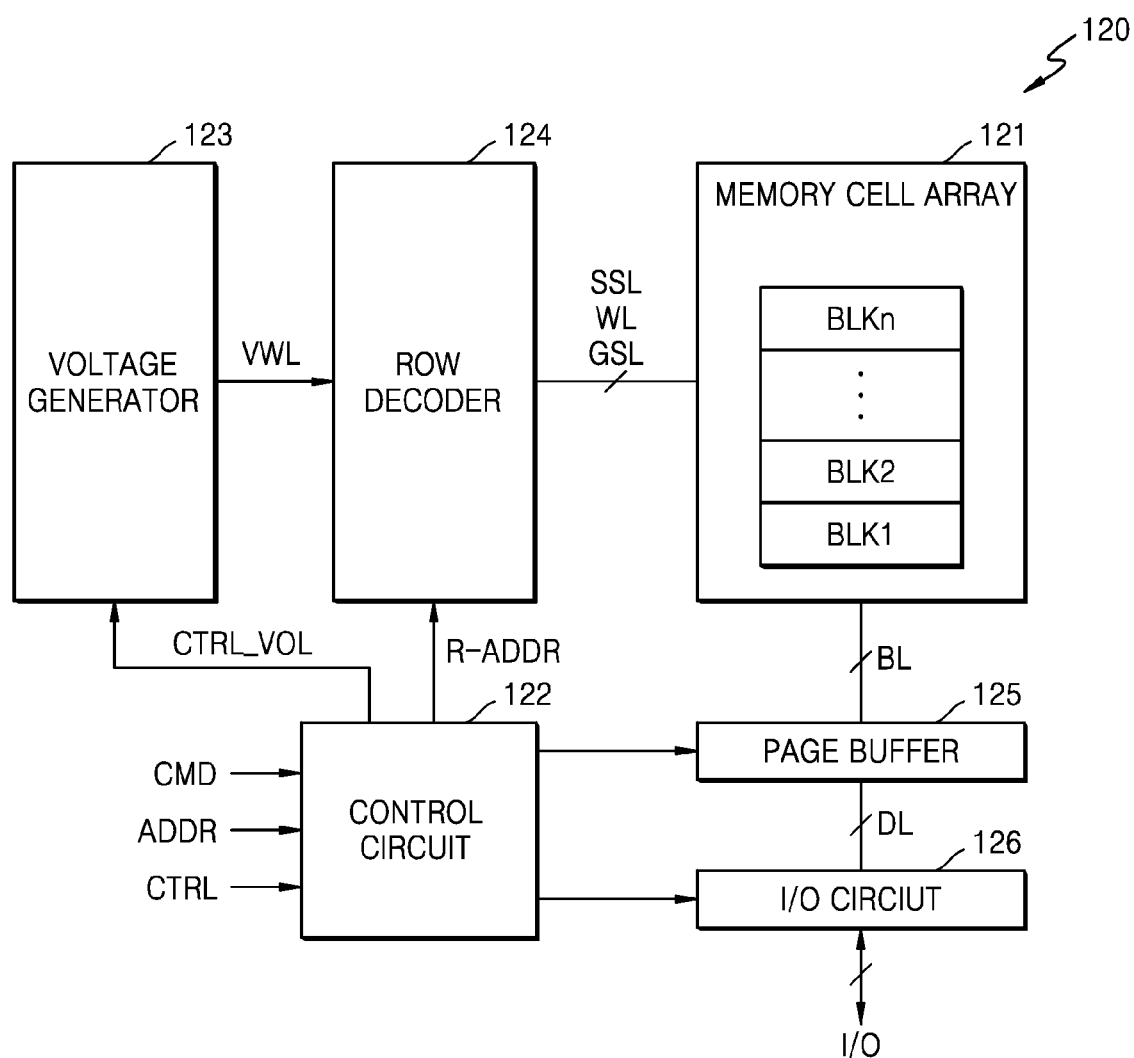
FIG. 3 is a block diagram of the memory device of FIG. 2 according to an example embodiment.

FIG. 3 is a block diagram of the memory device 120 of FIG. 2 according to an example embodiment. Referring to FIG. 3, the memory device 120 include the memory cell array 121, a row decoder 124, the control circuit 122, a page buffer 125, an input/output (I/O) circuit 126, and a voltage generator 123.

The memory cell array 121 may be connected to word lines WL, string select lines SSL, ground select lines GSL, and bit lines BL. The memory cell array 121 may be connected to the row decoder 124 via the word lines WL, the string select lines SSL, and the ground select lines GSL, and may be connected to the page buffer 125 via the bit lines BL.

The memory cell array 121 may include a plurality of memory blocks BLK1 to BLKn.

Each of the memory blocks BLK1 to BLKn may include a plurality of memory cells and a plurality of select transistors. The memory cells may be connected to the word lines WL, and the select transistors may be connected to the string select lines SSL or the ground select lines GSL. The memory cells of each of the memory blocks BLK1 to BLKn may include single level cells storing 1-bit data and multi-level cells storing M-bit data (M is an integer greater than or equal to 2).

The row decoder 124 may select one of the plurality of memory blocks BLK1 to BLKn of the memory cell array 121, select one of the word lines WL of the selected memory block, and select one of the plurality of string select lines SSL.

The control circuit 122 may output various internal control signals for performing the program, read, and erase operation on the memory cell array 121, based on a command CMD, an address ADDR, and a control signal CTRL received from the memory controller 110. The control circuit 122 may provide a row address R_ADDR to the row decoder 124, provide a column address to the I/O circuit 126, and provide a voltage control signal CTRL_VOL to the voltage generator 123.

The control circuit 122 may precharge channels of the plurality of cell strings with a precharge voltage of the bit lines via string select transistors before the select memory cell is programmed.

The page buffer 125 may function as a write driver or a sense amplifier according to an operation mode thereof. During the read operation, the page buffer 125 may sense a bit line of a selected memory cell under the control by the control circuit 122. The sensed data may be stored in latches provided in the page buffer 125. The page buffer 125 may transfer the data stored in the latches to the I/O circuit 126 via a data line DL under the control by the control circuit 122.

The I/O circuit 126 may temporarily store the command CMD, the address ADDR, and the data DATA received from the outside of the non-volatile memory device 120 via an input/output line I/O. The I/O circuit 126 may temporarily store read data of the non-volatile memory device 120 and output the stored read data to the outside via the input/output line I/O at a designated time point.

The voltage generator 123 may generate voltages of various types for performing the program, read, and erase operations on the memory cell array 121, based on the voltage control signal CTRL_VOL. For example, the voltage generator 123 may generate a word line voltage VWL, for example, a program voltage, a read voltage, a pass voltage, an erase voltage, an erase verification voltage, and the like. In addition, the voltage generator 123 may generate precharge voltages based on the voltage control signal CTRL_VOL.

Figure 4:
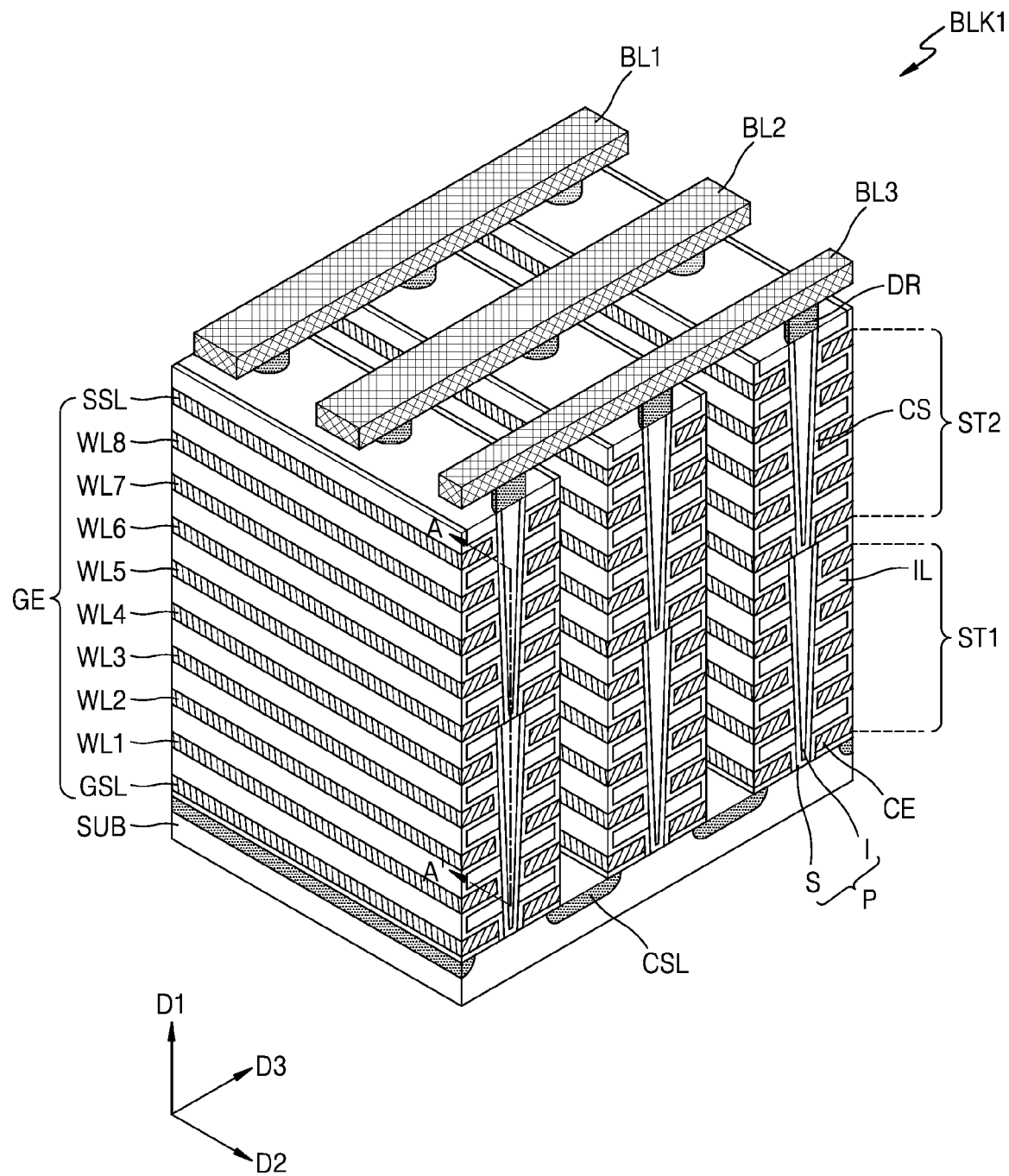
FIG. 4 is a perspective view illustrating the memory block of FIG. 3 according to an example embodiment.

FIG. 4 is a perspective view illustrating the memory block BLK1 of FIG. 3. Referring to FIG. 4, each of memory blocks included in a memory cell array (e.g., 121 of FIG. 3) may be vertically provided with respect to a substrate SUB. In FIG. 4, the memory block includes two select lines GSL and SSL, eight word lines WL1 to WL8, and three bit lines BL1 to BL3. However, the numbers thereof may be more or less than these.

A common source line CSL, which has a first conductivity type (e.g., p type), extends in a first direction (e.g., a D2 direction) on the substrate SUB, and is doped with impurities of a second conductivity type (e.g., n type), may be provided on the substrate SUB.

A first memory stack ST1 may be provided on the substrate SUB. In detail, in an area of the substrate SUB between two adjacent common source lines CSL, a plurality of insulation layers IL each extending in the first direction may be sequentially provided in a third direction (e.g., a D1 direction), and the plurality of insulation layers IL may be spaced apart by a certain distance in the third direction. For example, the plurality of insulation layers IL may include an insulation material, such as silicon oxide. A plurality of pillars P, which are sequentially arranged in the first direction and provided by etching through the plurality of insulation layers IL in the third direction, may be provided in the area of the substrate SUB between two adjacent common source lines CSL. For example, the plurality of pillars P may be in contact with the substrate SUB via the plurality of insulation layers IL. For example, a surface layer S of each of the pillars P may include a silicon material having a first conductivity type and function as a channel area. An inner layer I of each of the pillars P may include an insulating material such as a silicon oxide or an air gap.

A charge storage layer CS may be provided in an area between two adjacent common source lines CSL along exposed surfaces of the insulation layers IL, the pillars P, and the substrate SUB. The charge storage layer CS may include a gate insulation layer (also referred to as "a tunneling insulation layer"), a charge trap layer, and a blocking insulation layer. For example, the charge storage layer CS may have an oxide-nitride-oxide (ONO) structure. In addition, a gate electrode GE, such as the select lines GSL and SSL and the word lines WL1 to WL4, may be provided on an exposed surface of the charge storage layer CS in an area between the two adjacent common source lines CSL.

A second memory stack ST2, which is formed in the same manner as the first memory stack ST1, may be further provided in the memory block BLK1 according to the disclosure. Drains or drain contacts DR may be respectively provided on the plurality of pillars P that extend in a second memory stack ST2. For example, the drains or drain contacts DR may include a silicon material doped with impurities having the second conductivity type. Bit lines BL1 to BL3, which extend in a second direction (e.g., a D3 direction) and are spaced apart from each other by a certain distance in the first direction, may be provided on the drains or drain contacts DR.

Figure 5:
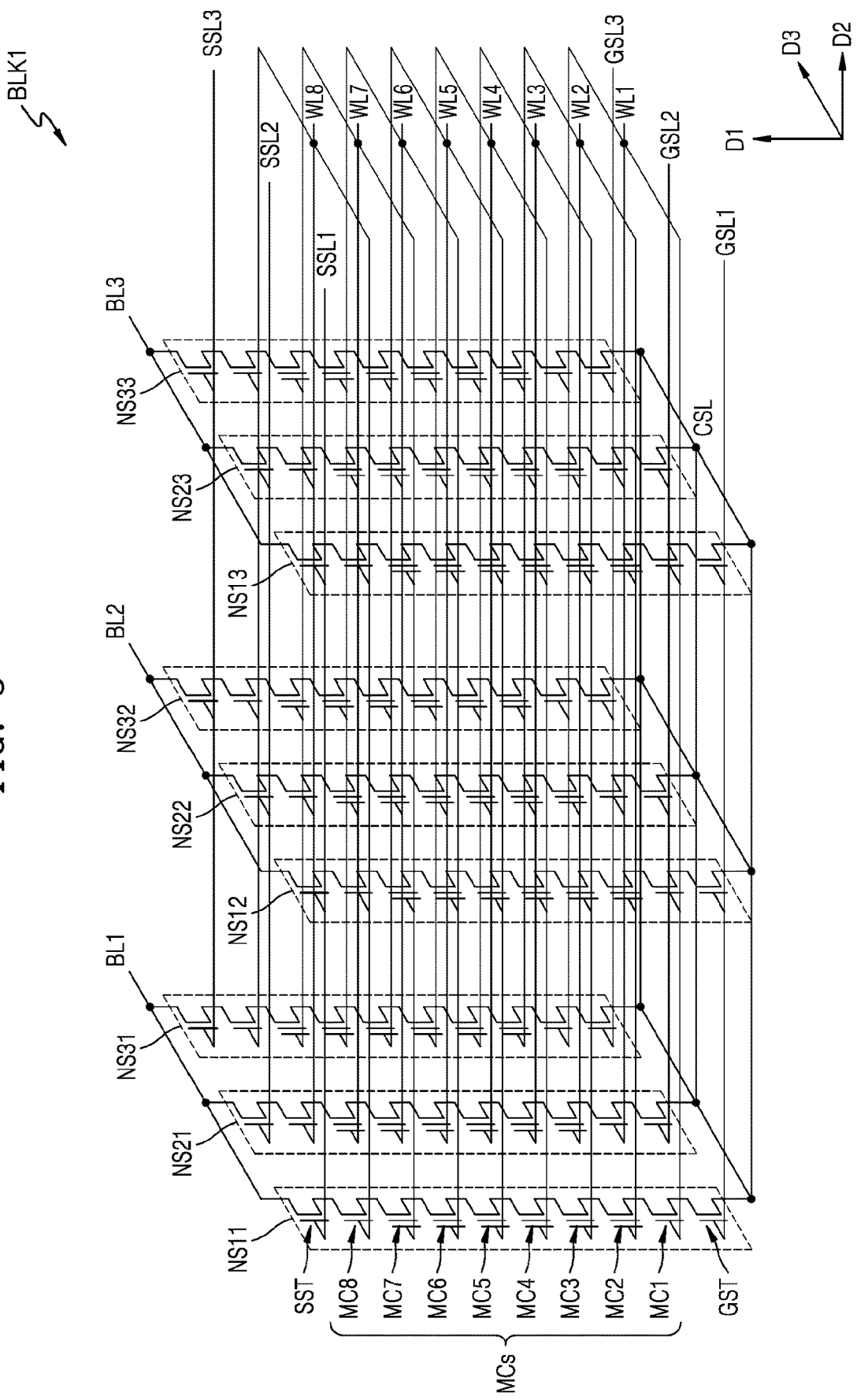
FIG. 5 is an equivalent circuit diagram of the memory block of FIG. 3 according to an example embodiment.

FIG. 5 is an equivalent circuit diagram of the memory block of FIG. 3 according to an example embodiment. The memory block shown in FIG. 5 is an example of one of the plurality of memory blocks BLK1 to BLKn described with reference to FIG. 3, and shows a first memory block BLK1. The first memory block BLK1 refers to a three-dimensional block having a three-dimensional structure on a substrate. A plurality of memory cell strings included in the first memory block BLK1 may be provided in a direction D1, perpendicular to the substrate.

Referring to FIG. 5, the first memory block BLK1 may include cell strings NS11 to NS33, word lines WL1 to WL8, bit lines BL1 to BL3, ground select lines GSL1 to GSL3, string select lines SSL1 to SSL3, and a common source line CSL. In FIG. 5, each of the cell strings NS11 to NS33 includes eight memory cells MCs that are respectively connected to the eight word lines WL1 to WL8, but the disclosure is not limited thereto.

Each of the cell strings (e.g., NS11) may include a string select transistor SST, the plurality of memory cells MCs, and a ground select transistor GST, which are connected to each other in series. The string select transistor SST may be connected to a corresponding string select line SSL1. The plurality of memory cells MCs may be respectively connected to corresponding word lines WL1 to WL8. The ground select transistor GST may be connected to a corresponding ground select line GSL1. The string select transistor SST may be connected to the corresponding bit line BL1, and the ground select transistor GST may be connected to the common source line CSL.

Figure 7:
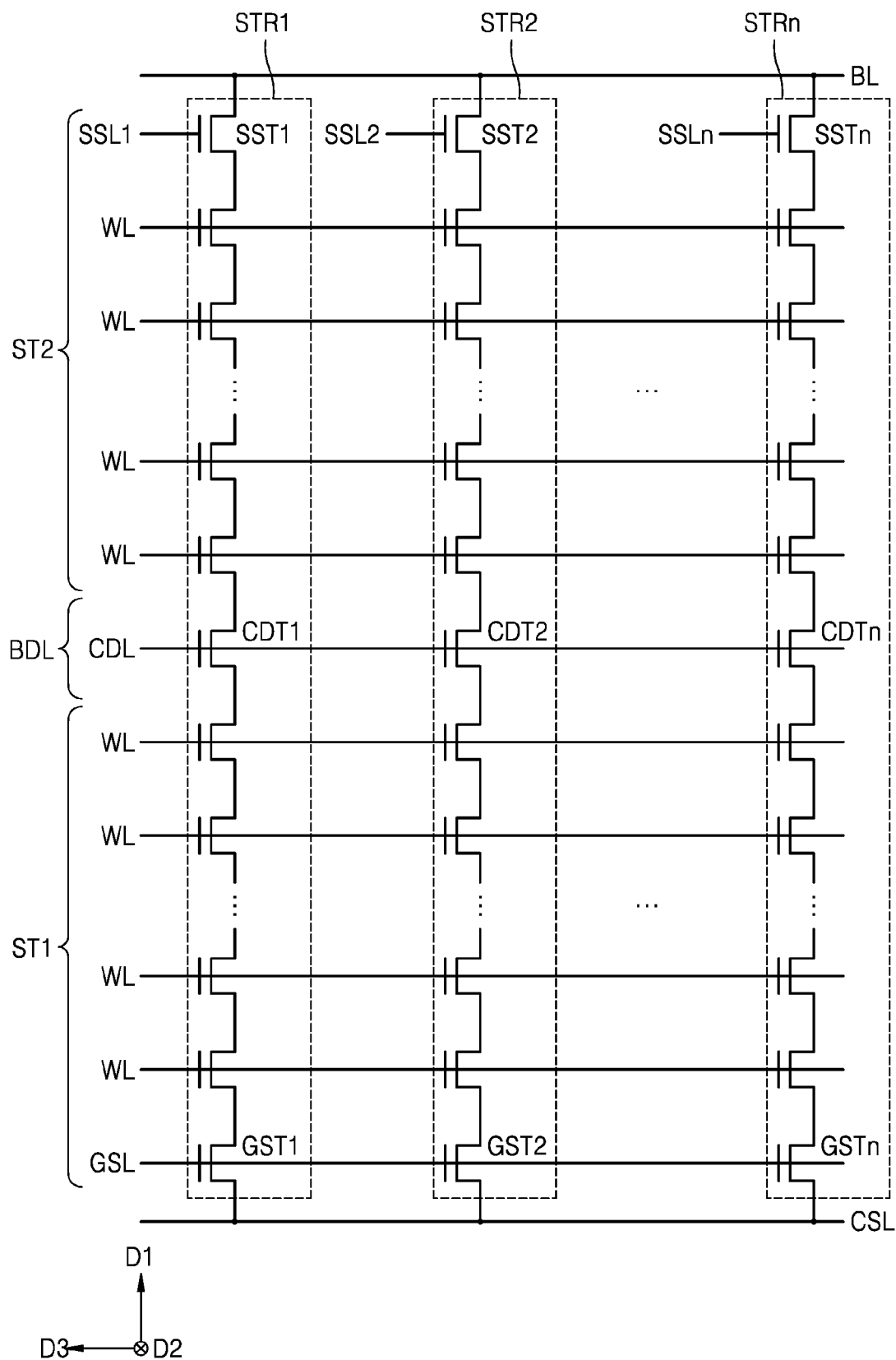
FIG. 7 is a circuit diagram illustrating a structure of a memory cell array having one center dummy line, according to an example embodiment.

In the cell strings NS11 to NS33, word lines (e.g., WL1) of the same height may be commonly connected, and the ground select lines GSL1, GSL2, and GSL3 and the string select lines SSL1, SSL2, and SSL3 may be respectively separated from each other. The cell strings NS11 to NS33 may include a word line corresponding to a center dummy line from among the plurality of word lines, as shown in FIG. 7 to be described below.

Figure 6:
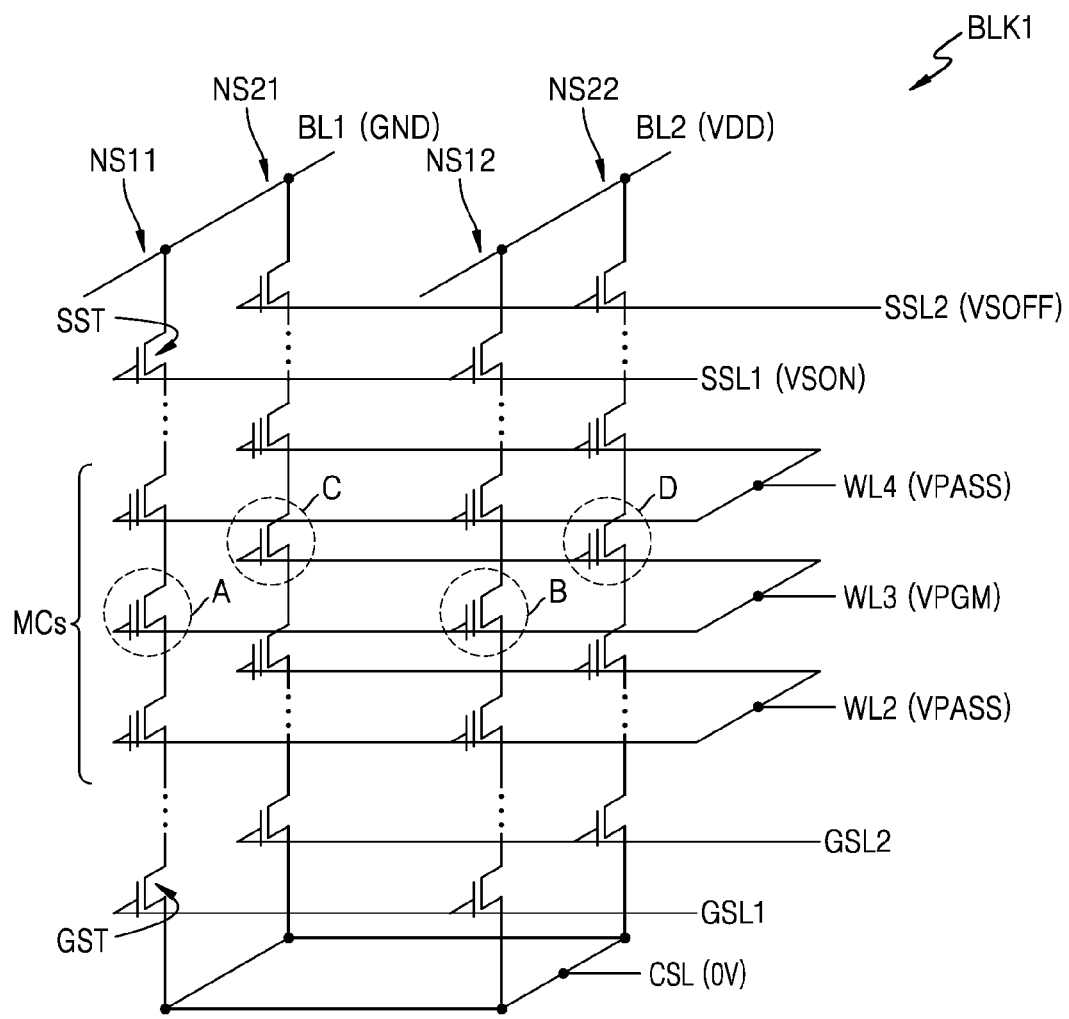
FIG. 6 is a diagram illustrating an example of a program bias condition of the memory block of FIG. 5 according to an example embodiment.

FIG. 6 is a diagram illustrating an example of a program bias condition of the memory block BLK1 of FIG. 5 according to an example embodiment. From among the cell strings NS11 to NS33 of the first memory block BLK1, for convenience, first and third cell strings NS11 and NS21 connected to the first bit line BL1 and second and fourth cell strings NS12 and NS22 connected to the second bit line BL2 are shown in FIG. 6. The first to fourth cell strings NS11, NS12, NS21, and NS22 may include first to fourth memory cells A, B, C, and D, respectively.

Referring to FIG. 6, the first bit line BL1 may include a program enable bit line to which a relatively low program enable voltage, for example, a ground voltage GND, is applied, and the second bit line BL2 may include a program prohibit bit line to which a relatively high program prohibit voltage, for example, a power voltage VDD, is applied.

A cell string connected to a string select line to which a string turn-on voltage VSON is applied may be referred to as a select cell string, and a cell string connected to a string select line to which a string turn-off voltage VSOFF is applied may be referred to as a non-select cell string. A select cell string connected to the program enable bit line may include a memory cell to be programmed, and a select cell string connected to the program prohibit bit line may include a memory cell not to be programmed.

For example, the first cell string NS11 may be selected to program the first memory cell A. To allow the first cell string NS11 to be selected, the string turn-on voltage VSON may be applied to the first string select line SSL1 connected to the first cell string NS11, and the string turn-off voltage VSOFF may be applied to the second string select line SSL2 connected to the third cell string NS21. The string turn-off voltage VSOFF includes a voltage that turns off a string select transistor SST, and may be the ground voltage GND. The string turn-on voltage VSON is a voltage that turns on the string select transistor SST, and may be the power voltage VDD.

A turn-off voltage may be applied to the ground select lines GSL1 and GSL2. The ground voltage GND, for example, a voltage of 0 V, may be applied to the source line CSL. A program voltage VPGM (e.g., 18 V) may be applied to a select word line (e.g., WL3), and a pass voltage VPASS (e.g., 8 V) may be applied to non-select word lines (e.g., WL2 and WL4).

In the program bias condition, 18 V may be applied to a gate of the first memory cell A, and a channel voltage may be 0 V. Accordingly, a strong electric field may be provided between the gate and the channel of the first memory cell A, and the first memory cell A may be programmed. Because a channel voltage of the second memory cell B is the power voltage VDD and a strong electric field is provided between a gate and a channel of the second memory cell B, the second memory cell B may not be programmed. Channels of the third and fourth memory cells C and D are in a floating state, and thus, a channel voltage is raised up to a boosting level by the pass voltage VPASS, and the third and fourth memory cells C and D may not be programmed.

FIG. 7 is a circuit diagram illustrating a structure of a memory cell array having one center dummy line, according to an example embodiment. For convenience, cell strings STR1 to STRn connected to one bit line BL and one common source line CSL from among cell strings of a memory block are shown in FIG. 7. However, the memory block may have a three-dimensional structure as described with reference to FIGS. 5 and 6. Referring to FIG. 7, the memory block may include a plurality of cell strings STR1 to STRn, which are connected to each other between the same bit line BL and the same common source line CSL. The cell strings STR1 to STRn may include string select transistors SST1 to SSTn controlled via string select lines SSL1 to SSLn, memory cells controlled via word lines WL, center dummy line transistors CDT1 to CDTn controlled via a center dummy line CDL, and ground select transistors GST1 to GSTn controlled via a ground select line GSL.

In FIG. 7, the ground select transistors GST1 to GSTn are connected to the same ground select line GSL. However, a certain number of ground select transistors may be connected to each of a plurality of ground select lines GSL. In an embodiment, as shown in FIG. 7, a boundary layer BDL may include one gate line. The gate line corresponds to a center dummy line CDL and may simultaneously control the center dummy line transistors CDT1 to CDTn connected thereto. In an embodiment, the boundary layer BDL may be disposed between a first stack ST1 and a second stack ST2. For convenience of description, it is shown that the boundary layer BDL is a separate layer disposed between the first stack ST1 and the second stack ST2. However, it may be understood that the boundary layer BDL is included in the first stack ST1 or the second stack ST2.

Figure 8:
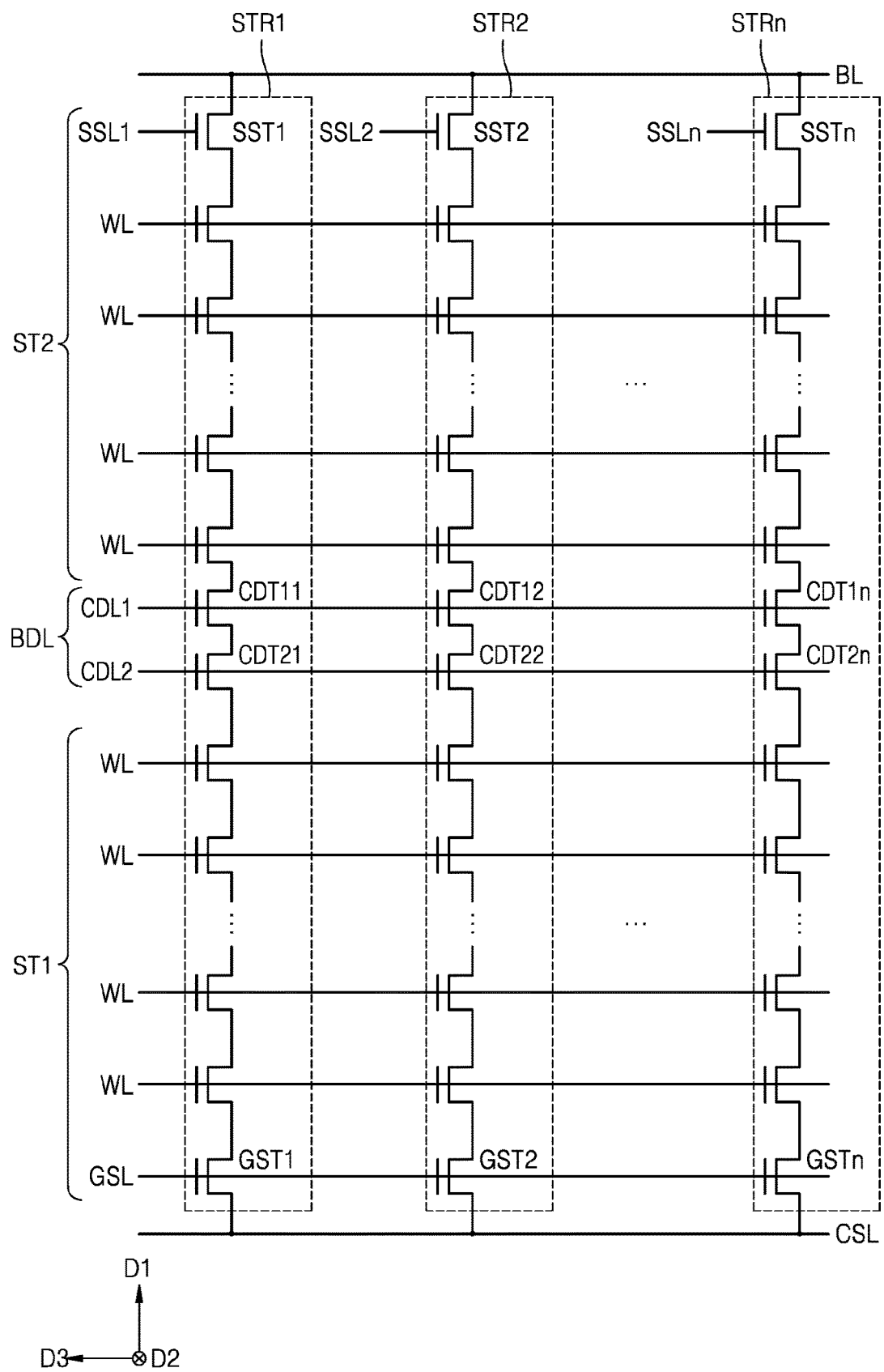
FIG. 8 is a circuit diagram illustrating a structure of a memory cell array having two center dummy lines, according to an example embodiment.

FIG. 8 is a circuit diagram illustrating a structure of a memory cell array having two center dummy lines, according to an example embodiment. In FIG. 8, two center dummy lines are provided, and descriptions already provided above with reference to FIG. 7 are omitted. The cell strings STR1 to STRn may include first center dummy line transistors CDT11 to CDT1$n$ controlled via a first center dummy line CDL1 and second center dummy line transistors CDT21 to CDT2$n$ controlled via a second center dummy line CDL2. In an embodiment, as shown in FIG. 8, the boundary layer BDL may include two gate lines. The two gate lines correspond to the first center dummy line CDL1 and the second center dummy line CDL2 and may control the first center dummy line transistors CDT11 to CDT1$n$ and the second center dummy line transistors CDT21 to CDT2$n$ respectively connected thereto. The first center dummy line CDL1 and the second center dummy line CDL2 may receive different voltages from each other. Accordingly, the first center dummy line transistors CDT11 to CDT1$n$ and the second center dummy line transistors CDT21 to CDT2$n$ may be controlled differently from each other. In addition, the first center dummy line CDL1 and the second center dummy line CDL2 may receive the same voltage so that the first center dummy line transistors CDT11 to CDT1$n$ and the second center dummy line transistors CDT21 to CDT2$n$ may be controlled the same as each other.

The boundary layer BDL may include at least three gate lines. The at least three gate lines correspond to center dummy lines, and center dummy line transistors connected thereto may be controlled via the respective gate lines. In an embodiment, the boundary layer BDL may be disposed between the first stack ST1 and the second stack ST2. For convenience of description, it is shown that the boundary layer BDL is a separate layer disposed between the first stack ST1 and the second stack ST2. However, it may be understood that a portion of the boundary layer BDL is included in the first stack ST1 or the second stack ST2.

Figure 9:
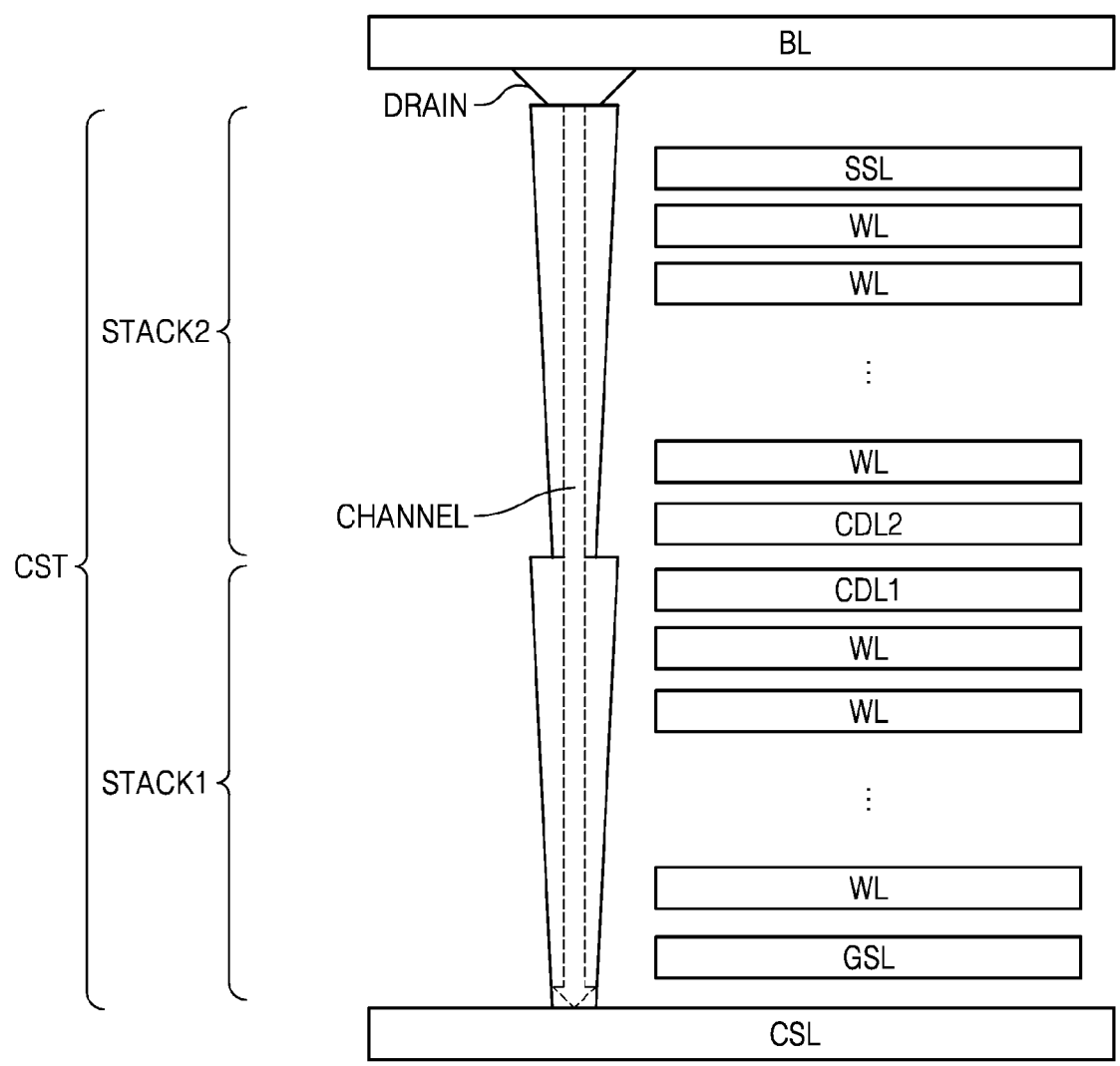
FIG. 9 is a diagram illustrating a two-stack cell string according to an example embodiment.

FIG. 9 is a diagram illustrating a two-stack cell string according to an example embodiment. In FIG. 9, for convenience, one cell string CST connected to one bit line BL and one common source line CSL from among cell strings of a memory block is shown. However, the memory block may have a three-dimensional structure as described with reference to FIGS. 5 and 6. Referring to FIG. 9, the cell string CST may include a string select transistor controlled via a string select line SSL, memory cells respectively controlled via word lines WL, center dummy line transistors respectively controlled via center dummy lines CDL1 and CDL2, a ground select transistor controlled via the ground select line GSL, a drain electrode DRAIN connected to a bit line BL, and a channel area CHANNEL connecting transistor channels of the cell string CST to each other. In an embodiment, as shown in FIG. 9, the cell string CST may be classified into a first stack STACK1 and a second stack STACK2 with the center dummy lines CDL1 and CDL2 as a boundary.

The bit line BL may be a program enable bit line or a program prohibit bit line. When the bit line BL is a program enable bit line, a program enable voltage, e.g., the ground voltage GND, may be applied during a program operation. When the bit line BL is a program prohibit bit line, a program prohibit voltage, e.g., the power voltage VDD, may be applied during a program operation.

The drain electrode DRAIN is an electrode that electrically connects the bit line BL and the channel area CHANNEL to each other, and may be metal, polysilicon which is doped, and the like.

The string select line SSL is a gate line of a string select transistor, and different voltages may be applied thereto according to a select cell string and a non-select cell string during a program operation. A string turn-on voltage (VSON of FIG. 11A) greater than or equal to a threshold voltage Vth of each string select line SSL of the select cell string may be applied to the string select line SSL. A string turn-off voltage (VSOFF of FIG. 11C), for example, the ground voltage GND, may be applied to a string select line SSL of the non-select cell string.

The word line WL is a gate line of the memory cells, and a pass voltage (e.g., VPASS of FIG. 11A), a constant pass voltage (e.g., S_VPASS of FIG. 11A), or a program voltage (e.g., PGM of FIG. 11A) may be applied to the word line WL.

The center dummy lines CDL1 and CDL2 are gate lines of the center dummy line transistor, and a turn-on voltage greater than or equal to a threshold voltage Vth of each of the center dummy lines CDL1 and CDL2, for example, a center dummy voltage (VCD of FIG. 11A) or a turn-off voltage, for example, the ground voltage (GND of FIG. 12) may be applied to the center dummy lines CDL1 and CDL2.

The ground select line GSL is a gate line of the ground select transistor, and a turn-on voltage greater than or equal to the threshold voltage Vth of each ground select line GSL, (e.g., the power voltage VDD) or a turn-off voltage (e.g., the ground voltage GND) may be applied to the ground select line GSL.

Figure 10:
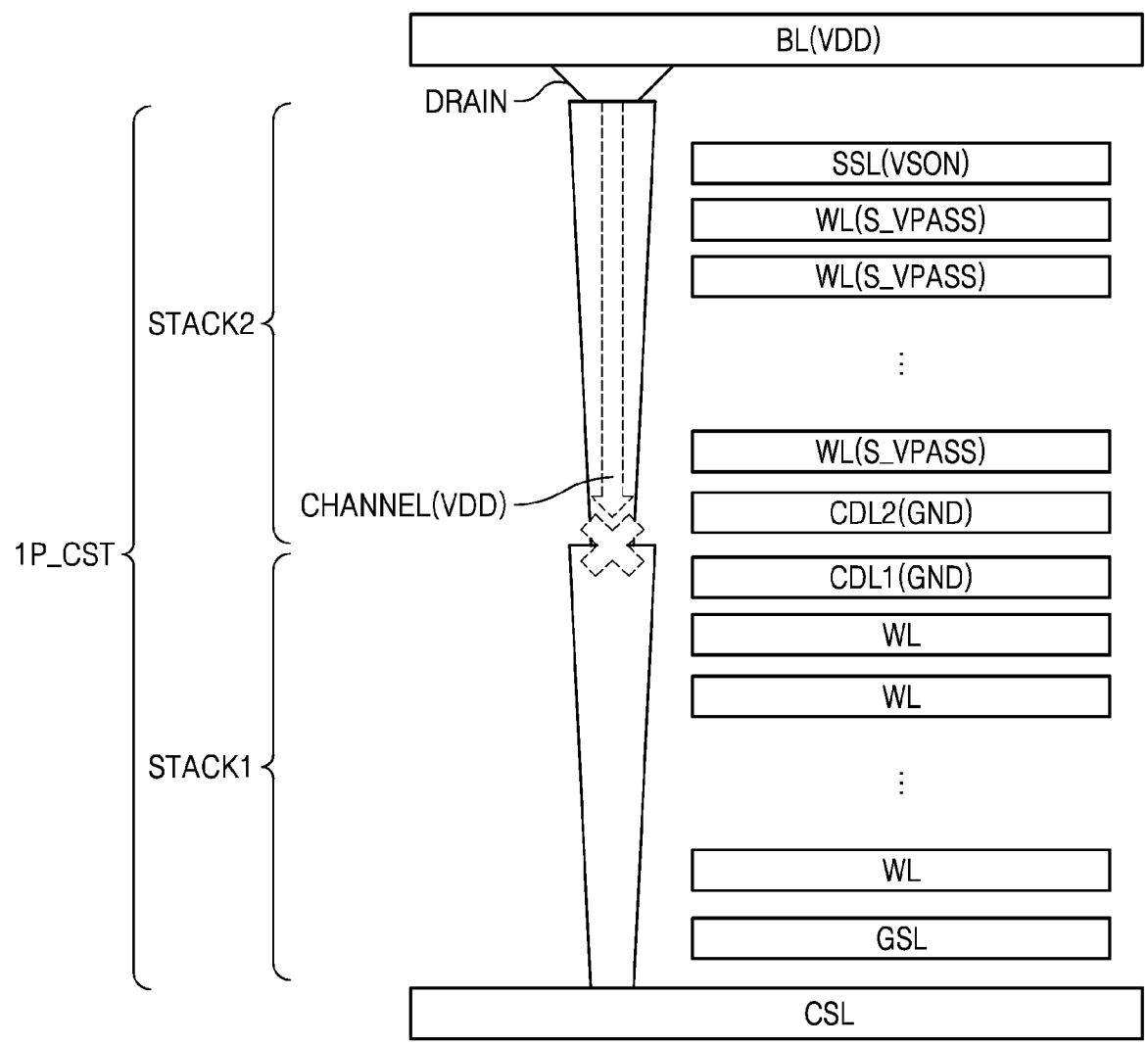
FIG. 10 is a diagram illustrating application of a program prohibit precharge voltage to a bit line according to an example embodiment.

FIG. 10 is a diagram illustrating application of a program prohibit precharge voltage to a bit line according to an example embodiment. FIG. 10 may correspond to a first bit line setup period BS1 of FIGS. 13A and 13B. For example, a cell string 1P_CST of FIG. 10 may correspond to the first to fourth cell strings NS11, NS12, NS21, and NS22 of FIG. 6 in the first bit line setup period BS1. Referring to FIG. 10, a program prohibit precharge voltage, e.g., the power voltage VDD, may be applied to a bit line. The string turn-on voltage VSON may be applied to both string select lines SSL of the select cell string and the non-select cell string, and the string select transistor may be turned on. A constant pass voltage S-VPASS may be applied to a word line WL of the second stack STACK2, and memory cells of the second stack STACK2 may be turned on.

The ground voltage GND may be applied to the center dummy lines CDL1 and CDL2, and the center dummy line transistors may be turned off. A program prohibit precharge voltage VDD applied to the bit line BL may be applied to a channel of the second stack STACK2 via the drain electrode DRAIN. By applying the program prohibit precharge voltage to all channels of the second stack STACK2 of the select cell string and the non-select cell string in the first bit line setup period BS1, a channel voltage of the second stack STACK2 of the non-select cell string may be maintained at the power voltage VDD as described below with reference to FIG. 11C.

Figure 11A:
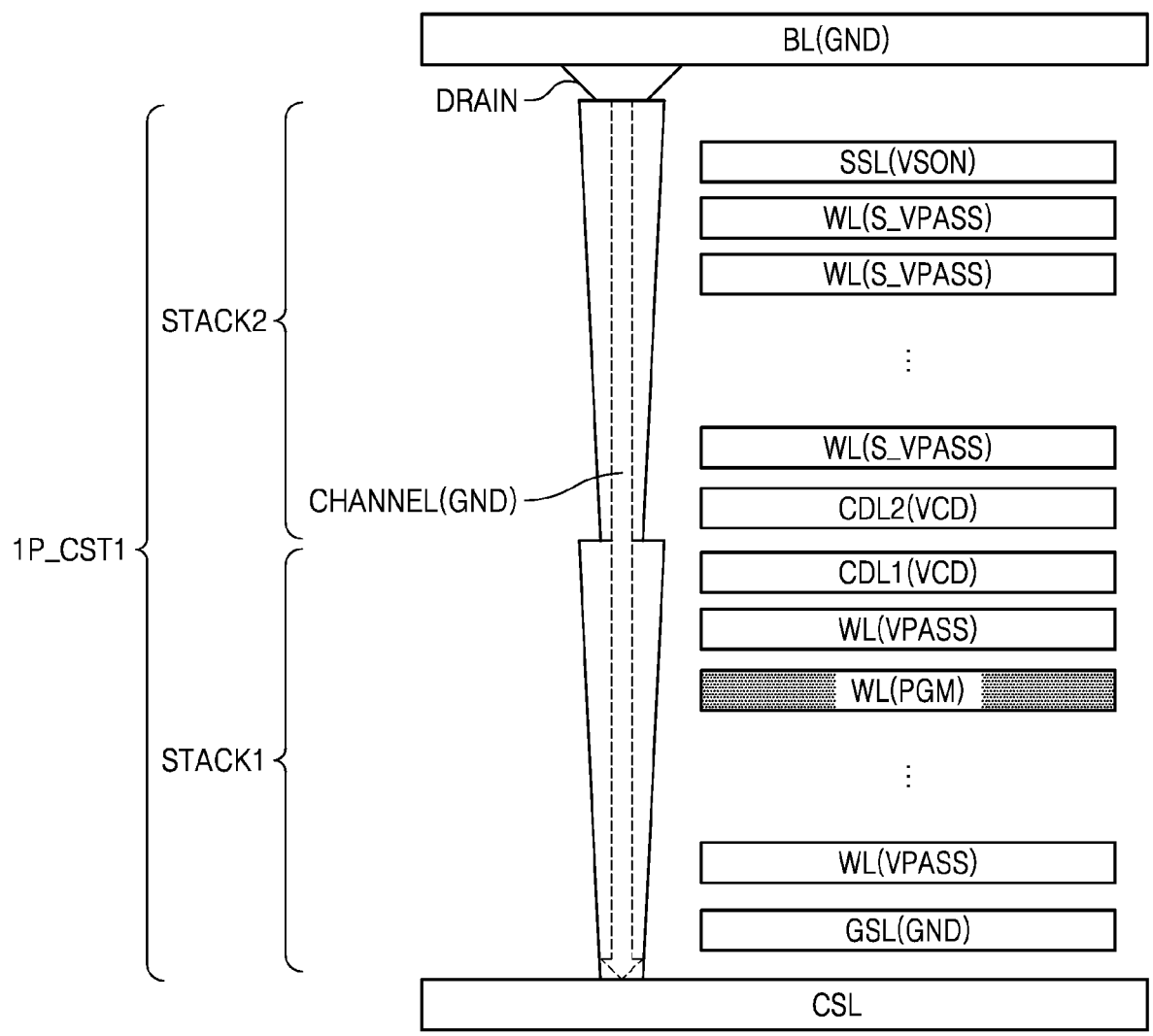
FIGS. 11A, 11B, and 11C are diagrams illustrating operations of a cell string when a first stack is programmed, according to an example embodiment.
Figure 11B:
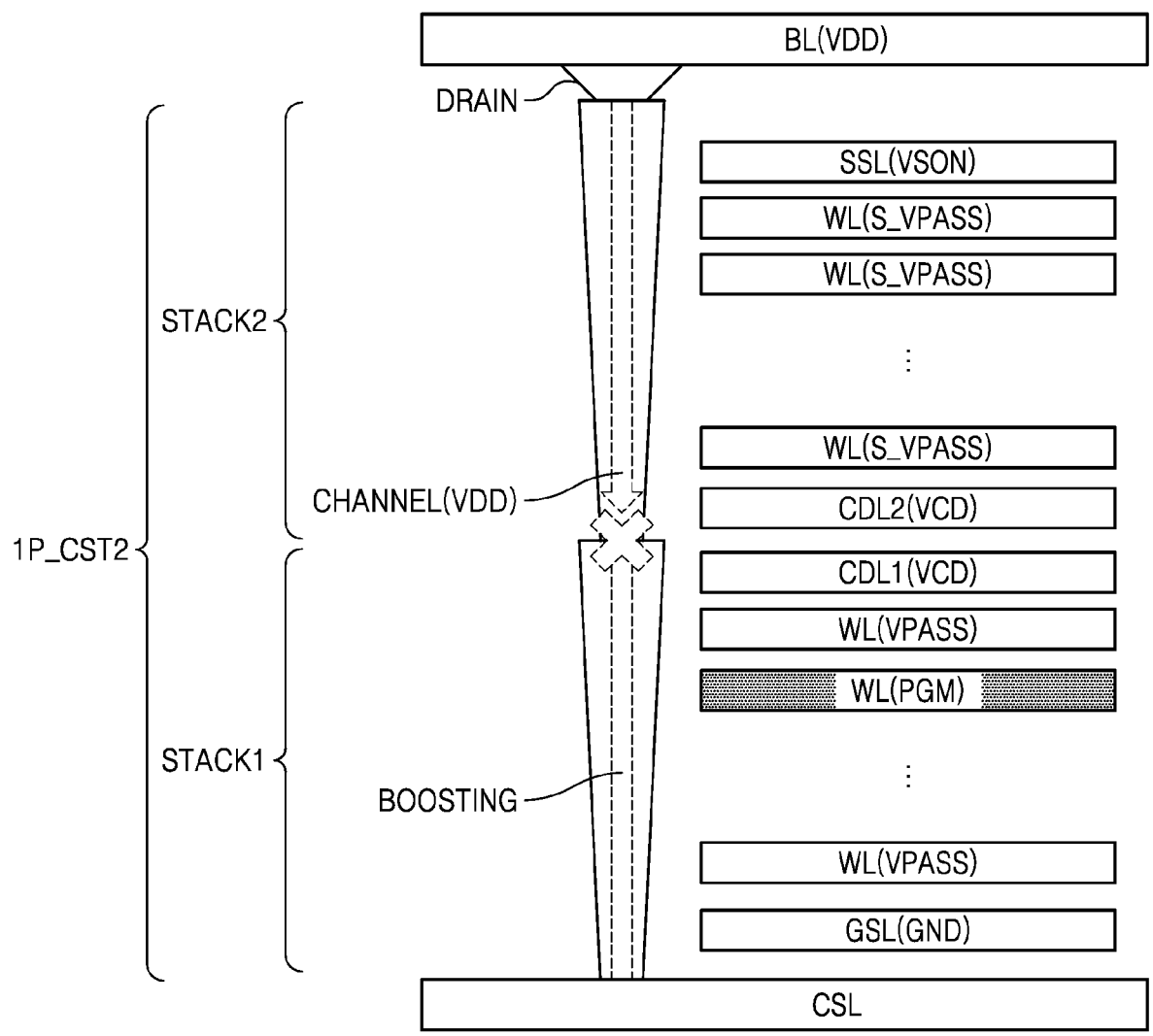
Figure 11C:
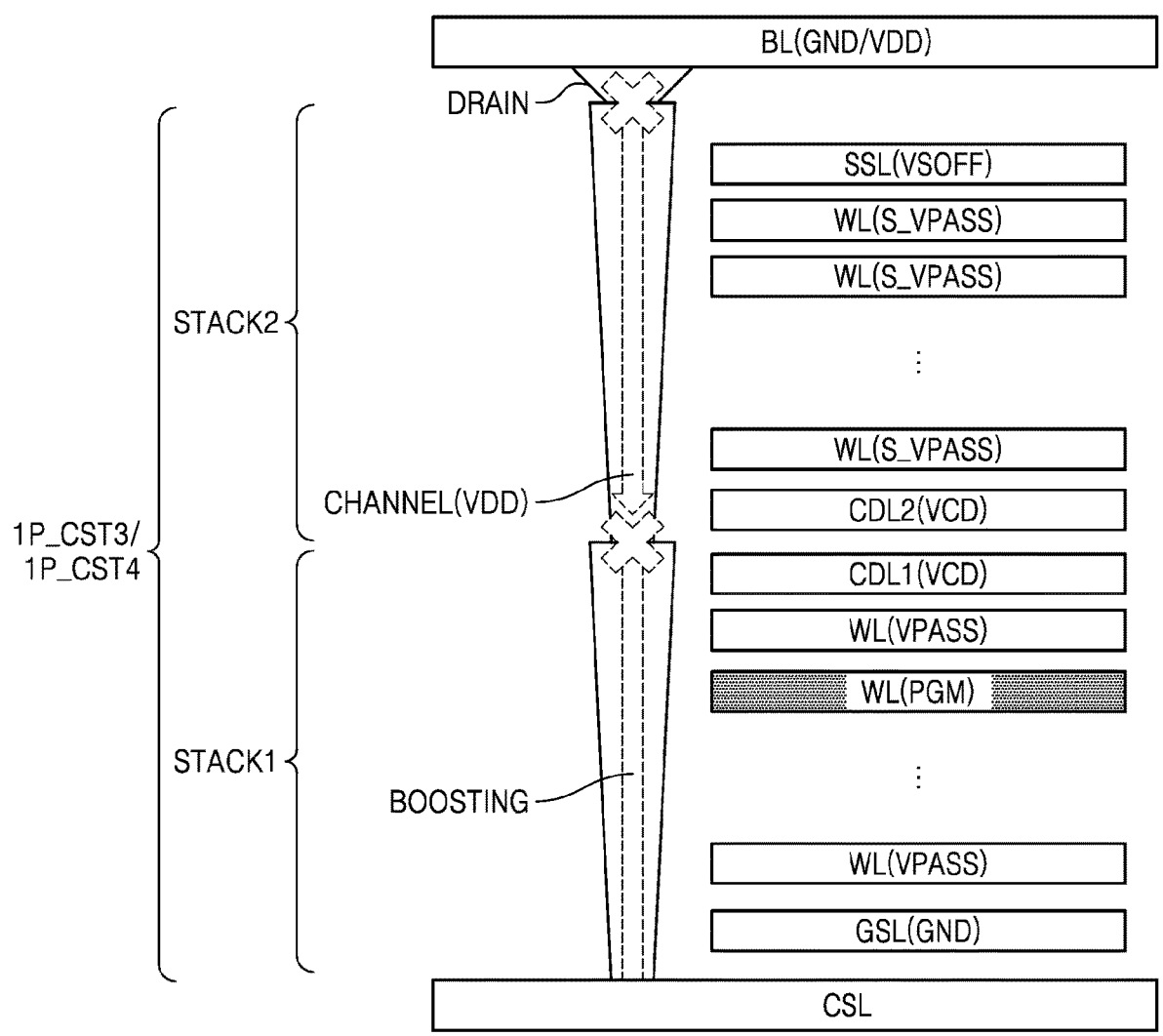

FIGS. 11A, 11B, and 11C are diagrams illustrating operations of a cell string when a first stack is programmed, according to an example embodiment. FIG. 11A may correspond to a second bit line setup period BS2 of FIG. 13A. For example, a cell string 1P_CST1 of FIG. 11A may correspond to the first cell string NS11 of FIG. 6 in the second bit line setup period BS2. A program enable bit line voltage, e.g., the ground voltage GND, may be applied to a bit line BL connected to the cell string 1P_CST1. Referring to FIG. 11A, the string turn-on voltage VSON may be applied to the string select line SSL of the select cell string, and the string select transistor may be turned on. In some embodiments, FIG. 11A may show a program execution period PGMEXE of FIG. 13A.

Referring to FIG. 11A, because the first stack STACK1 includes a select word line WL to be programmed, the first stack STACK1 may be referred to as a select stack, and because the second stack STACK2 does not include a select word line WL, the second stack STACK2 may be referred to as a non-select stack. The constant pass voltage S_VPASS may be applied to a non-select word line WL of the second stack STACK2 from a time point at which a program loop is started to a time point at which all program loops end, and the memory cells of the second stack STACK2 may be turned on. A center dummy voltage VCD may be applied to the center dummy lines CDL1 and CDL2, and the center dummy line transistors may be turned on. The center dummy voltage may be a voltage satisfying Equation (1).

$$VGS1 = VG1 - VS1 > VTH1 \quad (1)$$

In Equation (1), VGS1 indicates a difference between a gate voltage and a source voltage of the center dummy line transistor in a select cell string connected to a program enable bit line, VG indicates the gate voltage of the center dummy line transistor, VS indicates the source voltage of the center dummy line transistor, and VTH1 indicates a threshold voltage of the center dummy line transistor. For example, when VG1 is the center dummy voltage VCD, and VS1 is the ground voltage GND, Equation (1) may be expressed as VGS1=VCD−0>VTH1.

The pass voltage VPASS may be applied to a non-select word line WL of the first stack STACK1, and memory cells connected to the non-select word line WL of the first stack STACK1 may be turned on. A program voltage PGM may be applied to the select word line WL of the first stack STACK1, and a memory cell connected to the select word line WL may be programmed. The ground voltage GND may be applied to a ground select line GSL so that the ground select transistor is turned off.

Because all transistors of the first stack STACK1 and the second stack STACK2 are turned on, the ground voltage GND applied to the bit line BL may be applied to channels of the first stack STACK1 and the second stack STACK2 via the drain electrode DRAIN.

Figure 13A:
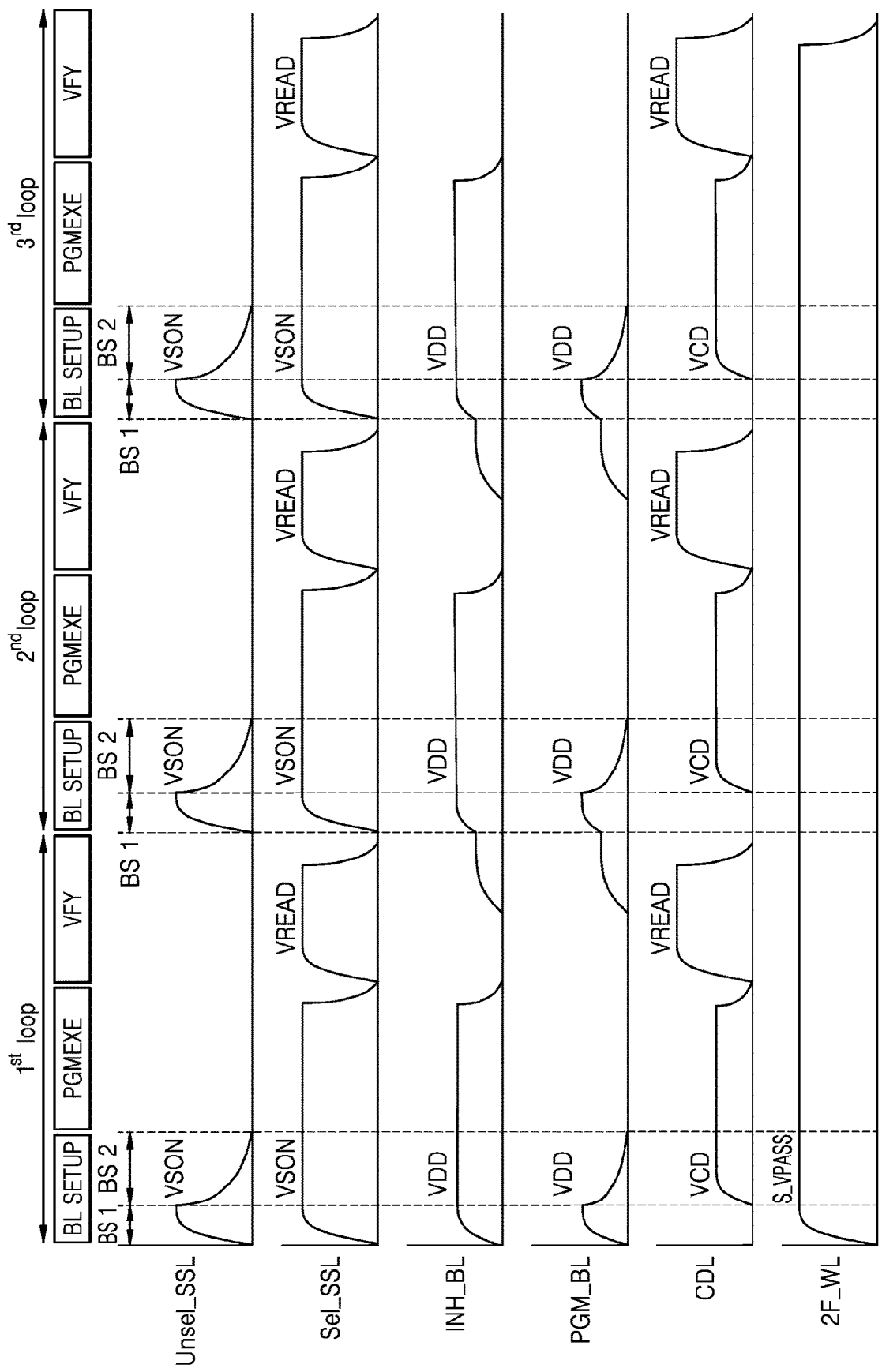
FIGS. 13A and 13B are a diagram illustrating a timing of voltage levels according to an example embodiment.

FIG. 11B may correspond to the second bit line setup period BS2 of FIG. 13A. For example, the cell string 1P_CST2 of FIG. 11B may correspond to the second cell string NS12 of FIG. 6 in the second bit line setup period BS2. The program prohibit bit line voltage, e.g., the power voltage VDD, may be applied to the bit line BL connected to the cell string 1P_CST2. In some embodiments, FIG. 11B may show the program execution period PGMEXE of FIG. 13A. Referring to FIG. 11B, the string turn-on voltage VSON may be applied to the string select line SSL of the select cell string, and the string select transistor may be turned on. A constant pass voltage S-VPASS may be applied to the word line WL of the second stack STACK2, and memory cells of the second stack STACK2 may be turned on.

Because transistors disposed over the center dummy line transistor connected to the second center dummy line CDL2 are turned on, the power voltage VDD applied to the bit line BL may be applied to the channel of the second center dummy line CDL2 via the drain electrode DRAIN. Accordingly, the power voltage VDD may be applied to source terminals of the center dummy line transistors connected to the second center dummy line CDL2, and the center dummy line transistors may be turned off because a difference between the gate voltage and the source voltage of the center dummy line transistors connected to the second center dummy line CDL2 is less than a threshold voltage VTH2. In other words, the center dummy voltage may be a voltage satisfying Equation (2).

$$VGS2 = VG2 - VS2 < VTH2 \quad (2)$$

In Equation (2), VGS2 indicates a difference between a gate voltage and a source voltage of the center dummy line transistor in a select cell string connected to the program prohibit bit line, VG2 indicates the gate voltage of the center dummy line transistor, VS2 indicates the source voltage of the center dummy line transistor, and VTH2 indicates a threshold voltage of the center dummy line transistor. For example, when VG2 is the center dummy voltage VCD, and VS2 is the power voltage VDD, Equation (2) may be expressed as VGS2=VCD−VDD<VTH2.

Referring to FIG. 5, a select cell string connected to the program enable bit line and a select cell string connected to the program prohibit bit line share a word line WL in the same memory block, and thus, VG1 of Equation (1) and VG2 of Equation (2) may have the same value VG. Accordingly, Equation (1) and Equation (2) may be expressed as Equation (3).

$$VTH1 + VS1 < VG < VTH2 + VS2 \quad (3)$$

For example, when VG2 is the center dummy voltage VCD, VS1 is the ground voltage GND, and VS2 is the power voltage VDD, Equation (3) may be expressed as VTH1<VCD<VDD+VTH2. When a threshold voltage level VTH1 of the center dummy line transistor of the select cell string connected to the program enable bit line and a threshold voltage level VTH2 of the center dummy line transistor of the select cell string connected to the program prohibit bit line are close to VTH, Equation (3) may be expressed as VTH<VCD<VDD+VTH.

The ground voltage GND may be applied to the ground select line GSL of the first stack STACK1 so that the ground select transistor is turned off. The first stack STACK1 may be floated by turning off the center dummy line transistor and the ground select transistor. Accordingly, a channel of the first stack STACK1 may be boosted while a program operation is performed. Accordingly, a pass voltage VPASS may be applied to the non-select word line WL of the first stack STACK1, and even when the program voltage PGM is applied to the select word line WL of the first stack STACK1, the memory cell of the first stack STACK1 may not be programmed.

Because the channel of the first stack STACK1 is boosted, even when the center dummy voltage VCD is applied to the first center dummy line CDL1 of the first stack STACK1, the difference between the gate voltage and the source voltage is less than the threshold voltage VTH, and thus, the center dummy line transistors connected to the first center dummy line CDL1 may be turned off.

FIG. 11C may correspond to the second bit line setup period BS2 of FIG. 13A. For example, cell strings 1P_CST3/1P_CST4 of FIG. 11C may correspond to the third and fourth cell strings NS21 and NS22 of FIG. 6 in the second bit line setup period BS2. For example, when the program enable bit line voltage, e.g., the ground voltage GND, is applied to the bit line BL connected to the cell string 1P_CST3, the cell string 1P_CST3 may correspond to the third cell string NS21 of FIG. 6. Alternatively, when the program prohibit bit line voltage, e.g., the power voltage VDD, is applied to the bit line BL connected to the cell string 1P_CST4, the cell string 1P_CST4 may correspond to the fourth cell string NS22 of FIG. 6. In some embodiments, FIG. 11C may show the program execution period PGMEXE of FIG. 13A.

Referring to FIGS. 10 and 11C, after the power voltage VDD is applied to the channel of the second stack STACK2, the string turn-off voltage VSOFF may be applied to the string select line SSL, and the string select transistor may be turned off. The constant pass voltage S-VPASS may be applied to a word line WL of the second stack STACK2, and memory cells of the second stack STACK2 may be turned on.

Because the transistors disposed over the center dummy line transistors of the second stack STACK2 are turned on, the power voltage VDD applied to the bit line BL may be applied to the channel of the second stack STACK2 via the drain electrode DRAIN, and the power voltage VDD may be applied to the source terminal of the center dummy line transistor. The center dummy voltage VCD may be applied to the center dummy lines CDL1 and CDL2, but as shown in FIG. 11B, the center dummy line transistors may be turned off because the difference between the gate voltage and the source voltage is less than the threshold voltage VTH as described with reference to FIG. 11B.

The ground voltage GND may be applied to the ground select line GSL of the first stack STACK1 so that the ground select transistor is turned off. The first stack STACK1 may be floated by turning off the center dummy line transistor and the ground select transistor. Accordingly, a channel of the first stack STACK1 may be boosted while a program operation is performed. Accordingly, a pass voltage VPASS may be applied to the non-select word line WL of the first stack STACK1, and even when the program voltage PGM is applied to the select word line WL of the first stack STACK1, the memory cell of the first stack STACK1 may not be programmed.

A program voltage PGM applied to a select word line WL as program loops progress by ISPP may gradually increase. A pass voltage applied to the non-select word line WL may also be gradually increased to reduce program voltage disturbance as the program voltage increases.

In the related art, a pass voltage applied to a non-select word line WL is gradually increased as a program loop progresses, without distinguishing between a select stack and a non-select stack.

However, in the disclosure, referring to FIGS. 11B and 11C, a non-select stack channel may be disconnected from a select stack by the center dummy line transistor. Accordingly, in the non-select stack, it is not necessary to increase the pass voltage as a program is executed, and thus, the pass voltage may not be changed in accordance with a change of program voltage PGM. Accordingly, the constant pass voltage S_VPASS may be applied to the word line WL of the non-select stack from the time point at which the program loop is started to a time point at which all program loops end. Because it is not necessary to increase a voltage of the word line WL of the non-select stack in accordance with ISPP, pass voltage disturbance may be reduced during a program operation, and an amount of current consumed by the non-select stack may be reduced.

Figure 12:
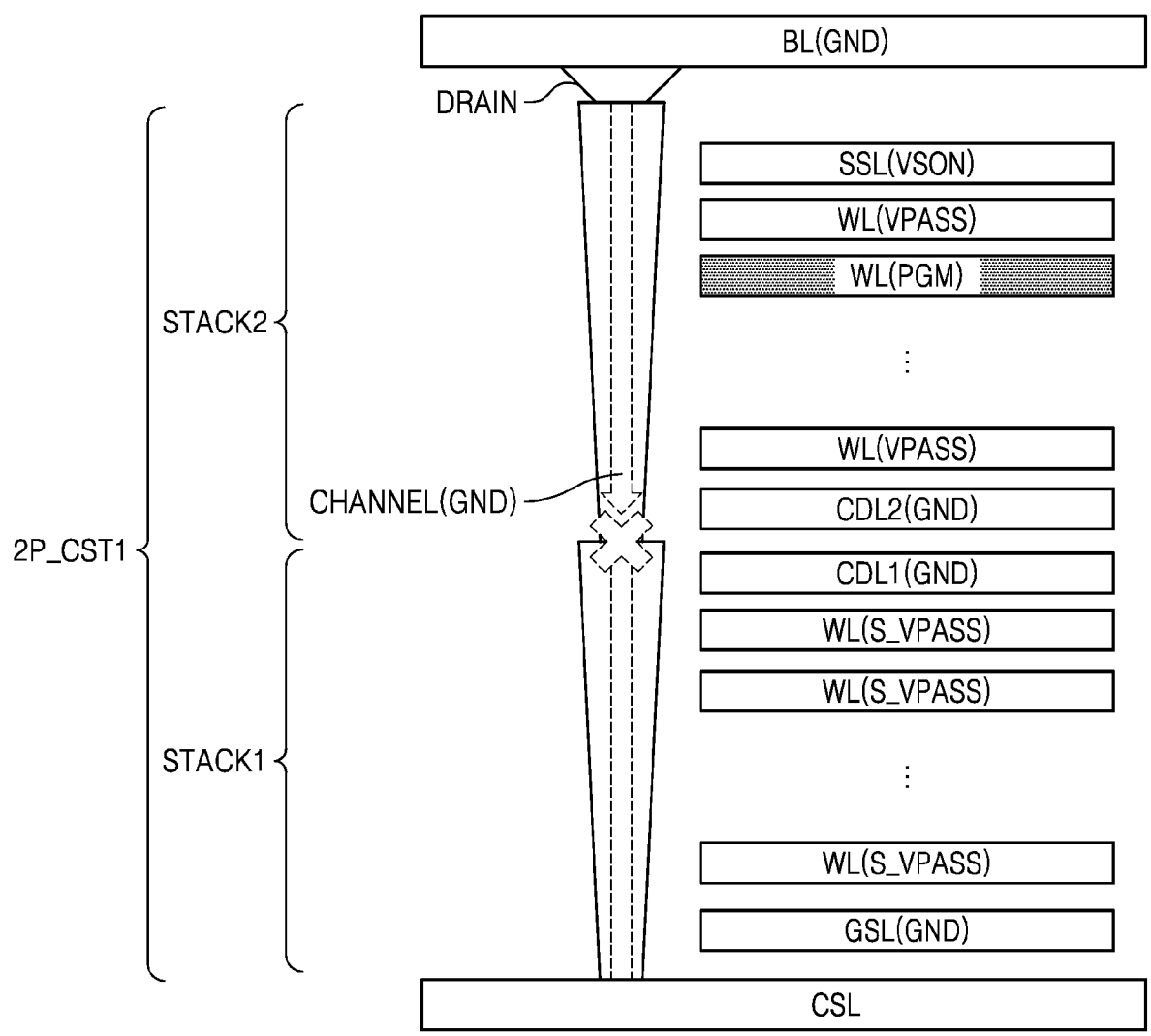
FIG. 12 is a diagram illustrating an operation of a cell string when a second stack is programmed according to an example embodiment.

FIG. 12 is a diagram illustrating an operation of a cell string when a second stack is programmed according to an example embodiment. FIG. 12 may correspond to the second bit line setup period BS2 of FIG. 13B. In some embodiments, FIG. 12 may show the program execution period PGMEXE of FIG. 13B. For example, a cell string 2P_CST1 of FIG. 12 may correspond to the first cell string NS11 of FIG. 6. However, unlike the cell strings 1P_CST1, 1P_CST2, 1P_CST3, and 1P_CST4 of FIGS. 11A to 11C, the select word line WL to be programmed may be included in the second stack STACK2 of the cell string 2P_CST1 of FIG. 12. Therefore, the second stack STACK2 is a select stack, and the first stack STACK1 may be referred to as a non-select stack because the first stack STACK1 does not include the select word line WL.

In addition, the second bit line setup period BS2 for the second to fourth cell strings NS12, NS21, and NS22 may be described through FIGS. 11B and 11C except that a selected word line is included in the second stack STACK2 in the second bit line setup period BS2.

Figure 13B:
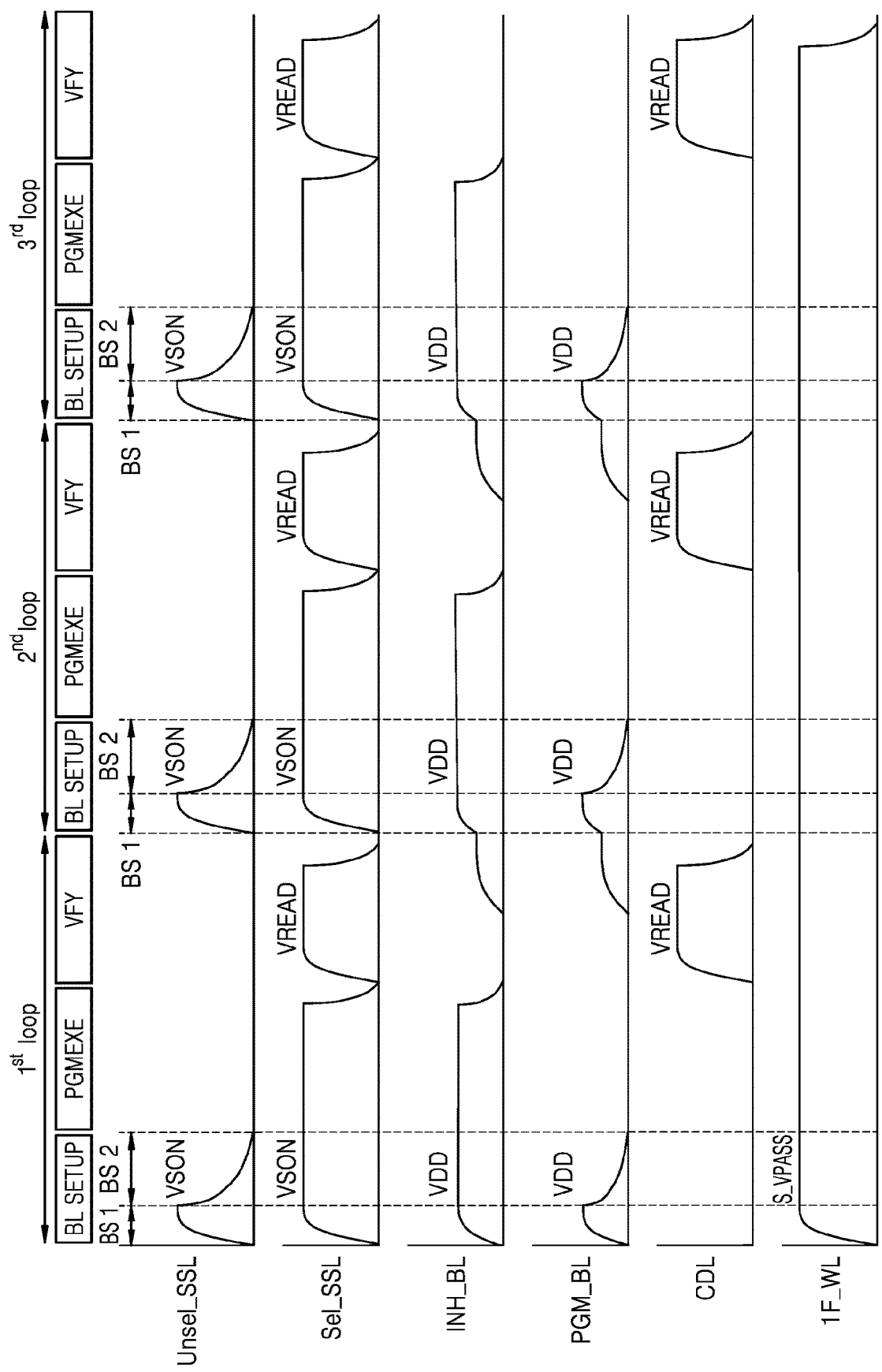

In the second bit line setup period BS2 of FIG. 13B, a program enable voltage, e.g., the ground voltage GND, may be applied to the program enable bit line. The ground voltage GND may be applied to the channel CHANNEL of the second stack STACK2 via the drain electrode DRAIN from the program enable bit line BL. A program operation for the second stack STACK2 may be performed by applying a program voltage PGM to the select word line WL of the second stack STACK2 and applying a pass voltage VPASS to the other word lines WL. The ground voltage GND may be applied to the center dummy lines CDL1 and CDL2, and the center dummy transistors may be turned off. Because the word lines WL of the non-select stack are not involved in channel boosting, the constant pass voltage S_VPASS may be applied to the word lines WL of the non-select stack. The ground voltage GND may be applied to a ground select line GSL so that the ground select transistor is turned off.

FIGS. 13A and 13B are a diagram illustrating a timing of voltage levels according to an example embodiment. FIG. 13A may be a timing diagram in a case where the first stack STACK1 is programmed, and FIG. 13B may be a timing diagram in a case where the second stack STACK2 is programmed. FIGS. 13A and 13B may be timing diagrams of voltage levels during three program loops ($1^{st}$ loop, $2^{nd}$ loop, and $3^{rd}$ loop). Each of the loops may include a bit line setup period BL SETUP, a program execution period PGMEXE, and a verification period VFY. The bit line setup period BL SETUP may be classified into a first bit line setup period BS 1 and a second bit line setup period BS 2.

FIG. 13A may be described with reference to FIGS. 10 to 11C. During the first bit line setup period BS 1, the string turn-on voltage VSON may be applied to the string select lines SSL of the non-select cell string and the select cell string so that the respective string select transistors are turned on. A program prohibit precharge voltage, e.g., the power voltage VDD, may be applied to the program prohibit bit line BL and the program enable bit line BL. The ground voltage GND may be applied to the center dummy line CDL, and the center dummy line transistors may be turned off. The constant pass voltage S_VPASS may be applied to the word line WL of the second stack STACK2, which is a non-select stack, and the constant voltage level may be maintained until the third program loop ends. The constant voltage level may be a read voltage VREAD or a pass voltage VPASS that is a voltage level of the non-select word line WL of a select stack.

The ground voltage GND may be applied to the string select line SSL of the non-select cell string during the second bit line setup period BS 2, and the string select transistor may be turned off so that the channel of the non-select cell string may be maintained at the power voltage VDD. A voltage applied to the program enable bit line may be reduced to the ground voltage GND by discharging the program prohibit precharge voltage. The center dummy voltage VCD may be applied to the center dummy line so that the center dummy line transistor of the select cell string connected to the program enable bit line BL is turned on. In addition, the center dummy voltage VCD may be applied to the center dummy line so that the center dummy line transistors of the non-select cell string and the select cell string connected to the program prohibit bit line BL may be maintained in a turn-off state.

In the program execution period PGMEXE, a memory cell may be programmed by a tunneling phenomenon due to a difference between a channel voltage and the program voltage PGM in the memory cell connected to the select word line WL of the first stack STACK1, which is a select stack of a select cell string connected to the program enable bit line BL. While the memory cell is programmed, a voltage of the word line WL of the second stack STACK2, which is a non-select stack, may be maintained constant, and a pass voltage may not be gradually increased. Therefore, pass voltage disturbance may be reduced.

In the verification period VFY, a verification operation may be performed on a memory cell programmed during the program execution period PGMEXE. The read voltage VREAD may be applied to the string select line SSL of the select cell string and the center dummy line CDL so that transistors respectively connected to the lines are turned on. A precharge voltage may be applied to the program enable bit line BL and the program prohibit bit line BL during the verification period.

A recovery operation of initializing voltages of the word line WL at a time point at which a program loop ends may be performed. At a time point at which all program loops end, a voltage of the word line WL of the non-select stack may also be initialized to the ground voltage GND from the constant pass voltage S_VPASS.

FIG. 13B may be described with reference to FIGS. 10 and 12. Descriptions already provided above with reference to FIG. 13A are omitted. The ground voltage GND may be applied to the center dummy line so that the center dummy transistors of the select cell string and the non-select cell string may be maintained in a turn-off state during the bit line setup period BL SETUP and the program execution period PGMEXE. The constant pass voltage S_VPASS may be applied to the word line WL of the first stack STACK1, which is a non-select stack, and the constant voltage level may be maintained until the third program loop ends.

In the program execution period PGMEXE, a memory cell may be programmed by a tunneling phenomenon due to a difference between a channel voltage and the program voltage PGM in the memory cell connected to the select word line WL of the second stack STACK2, which is a select stack of a select cell string connected to the program enable bit line BL. While the memory cell is programmed, a voltage of the word line WL of the first stack STACK1, which is a non-select stack, may be maintained constant, and a pass voltage may not be gradually increased. Therefore, pass voltage disturbance may be reduced.

Figure 14A:
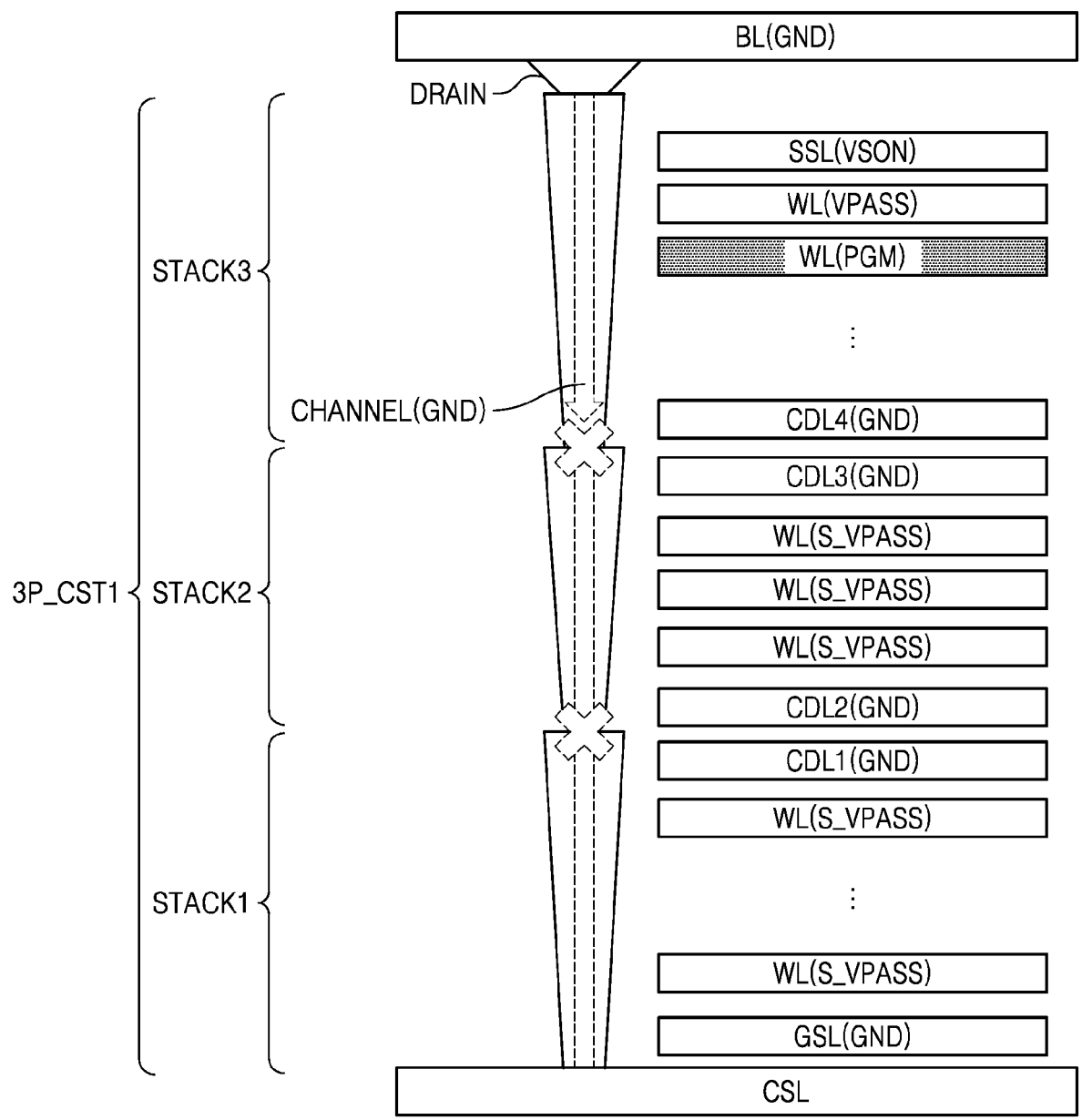
FIGS. 14A, 14B, and 14C are diagrams illustrating an operation of a three-stack cell string according to an example embodiment.
Figure 14B:
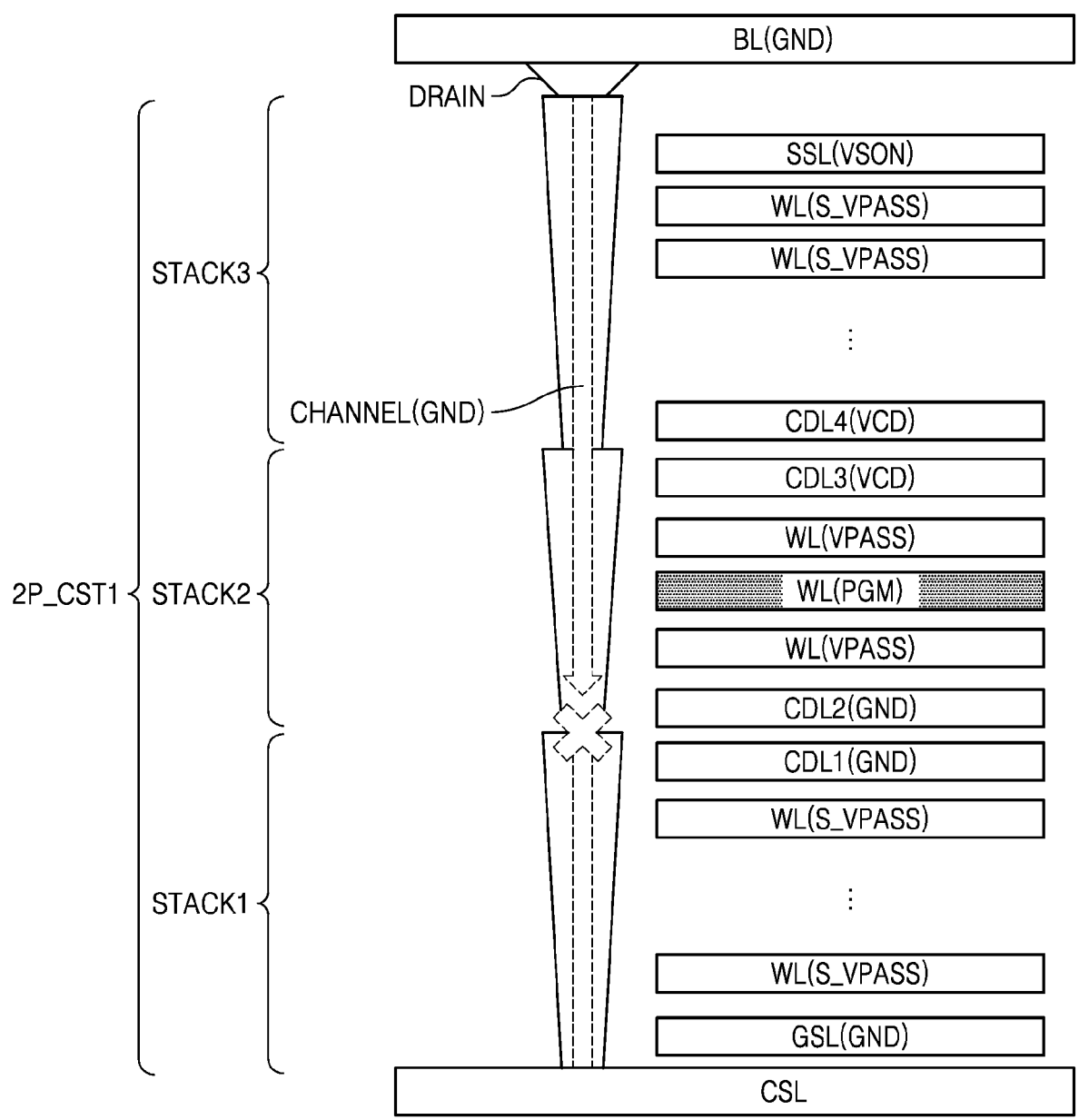
Figure 14C:
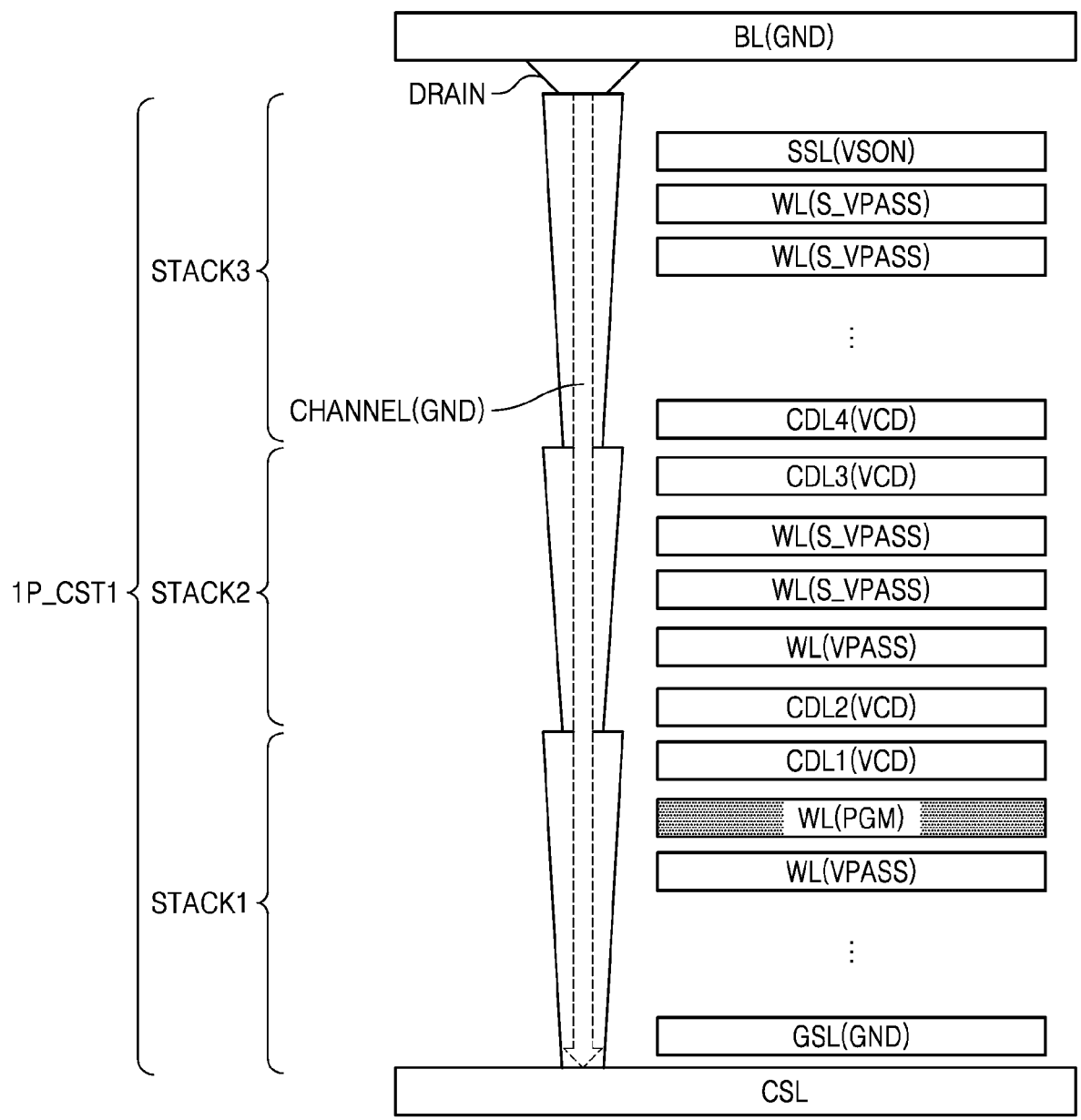

FIGS. 14A, 14B, and 14C are diagrams illustrating an operation of a three-stack cell string according to an example embodiment. Cell strings 3P_STR1, 2P_STR1, and 1P_STR1 of FIGS. 14A, 14B, and 14C may correspond to the first cell string NS11 of FIG. 6. In addition, the second to fourth cell strings NS12, NS21, and NS22 of FIG. 6 may be described through FIGS. 11B and 11C except that the number of stacks is three. In FIG. 14A, the select cell string 3P_CST1 connected to the program enable bit line BL when a third stack STACK3 is programmed in the three-stack cell string may be shown. Because the third stack STACK3 includes the select word line WL to be programmed, the third stack STACK3 may be referred to as a select stack, and because the first stack STACK1 and the second stack STACK2 do not include the select word line WL, the first stack STACK1 and the second stack STACK2 may be referred to as non-select stacks. During the program execution period PGMEXE, a program enable voltage, e.g., the ground voltage GND, may be applied to the program enable bit line BL. The ground voltage GND may be applied to the channel CHANNEL of the third stack STACK3 from the program enable bit line BL via the drain electrode DRAIN. A program operation for the third stack STACK3 may be performed by applying the program voltage PGM to the select word line WL of the third stack STACK3 and applying the pass voltage VPASS to the other word lines WL. The ground voltage GND may be applied to the first to fourth center dummy lines CDL1 to CDL4, and the center dummy line transistors may be turned off. Because the word lines WL of the non-select stack are not involved in channel boosting, the constant pass voltage S_VPASS may be applied to the word lines WL of the non-select stack. The ground voltage GND may be applied to a ground select line GSL so that the ground select transistor is turned off.

In FIG. 14B, the select cell string 2P_CST1 connected to the program enable bit line BL when the second stack STACK2 is programmed in the three-stack cell string may be shown. Referring to FIG. 14B, because the second stack STACK2 includes the select word line WL to be programmed, the second stack STACK2 may be referred to as a select stack, and because the first stack STACK1 and the third stack STACK3 do not include the select word line WL, the first stack STACK1 and the third stack STACK3 may be referred to as non-select stacks. Because the word lines WL of the non-select stack are not involved in channel boosting, the constant pass voltage S_VPASS may be applied to the word lines WL of the non-select stack, and the memory cells connected to the non-select word line WL may be turned on. The center dummy voltage VCD may be applied to center dummy lines CDL3 and CDL4, which are adjacent to the boundary in a direction to the bit line BL of the select stack, and the center dummy transistors may be turned on. On the other hand, the ground voltage GND may be applied to the center dummy lines CDL1 and CDL2, which are adjacent to the boundary in a direction to the common source line of the select stack, and the center dummy transistors may be turned off.

In FIG. 14C, the select cell string 1P_CST1 connected to the program enable bit line BL when the first stack STACK1 is programmed in the three-stack cell string may be shown. Referring to FIG. 14C, because the first stack STACK1 includes the select word line WL to be programmed, the first stack STACK1 may be referred to as a select stack, and because the second stack STACK2 and the third stack STACK3 do not include the select word line WL, the second stack STACK2 and the third stack STACK3 may be referred to as non-select stacks. Because the word lines WL of the non-select stack are not involved in channel boosting, the constant pass voltage S_VPASS may be applied to the word lines WL of the non-select stack, and the memory cells connected to the non-select word line WL may be turned on. The center dummy voltage VCD may be applied to the center dummy lines CDL1 and CDL2, which are adjacent to the boundary in the direction to the bit line BL of the select stack, and the center dummy lines CDL3 and CDL4 located between the select stack and the bit line BL, and the center dummy transistors may be turned on.

Figure 15:
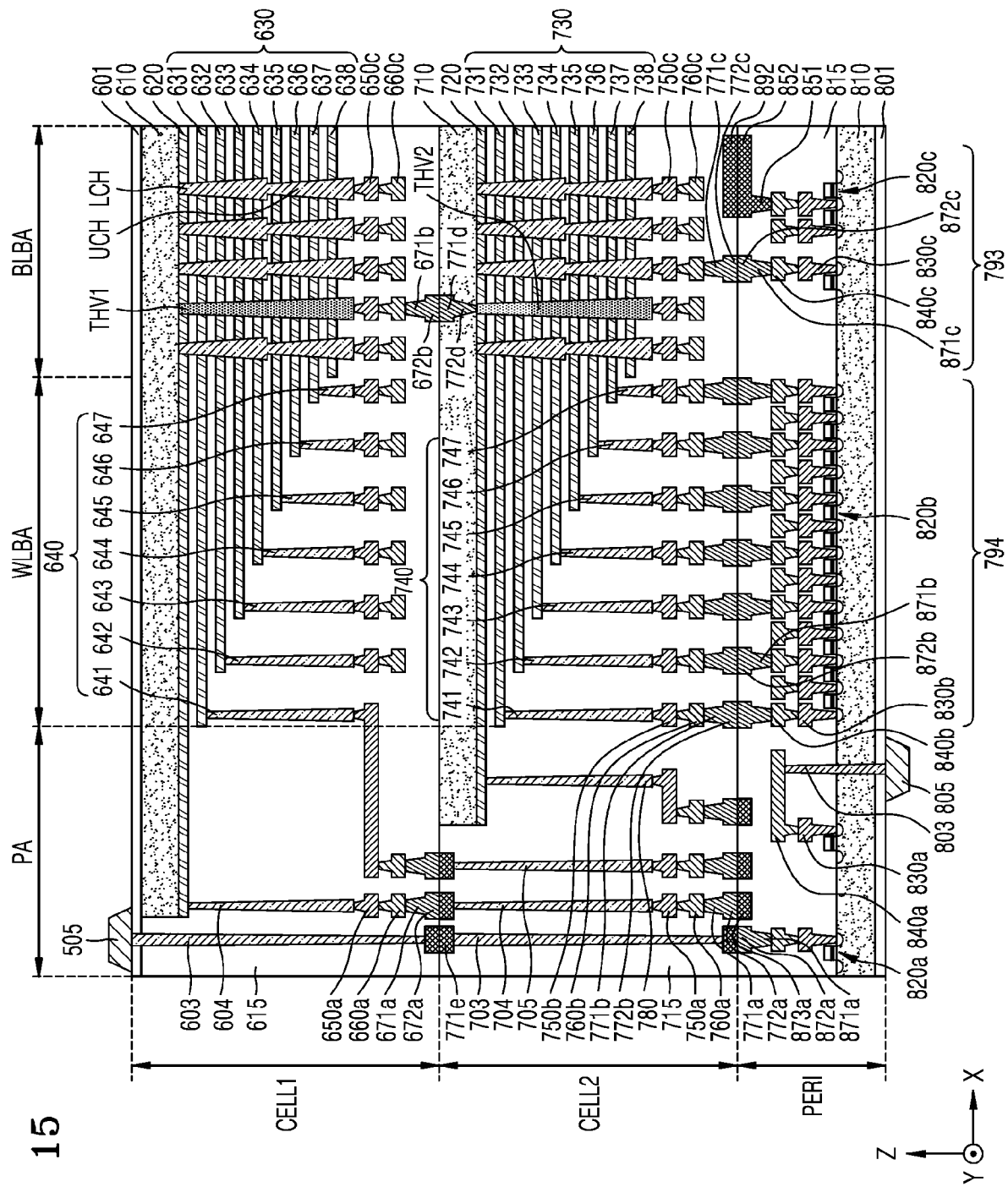
FIG. 15 is a diagram illustrating a BV NOT AND (NAND) structure according to an example embodiment.

FIG. 15 is a diagram illustrating a BV NOT AND (NAND) structure according to an example embodiment. A memory device of FIG. 15 may include at least two upper chips each including a cell area. For example, the non-volatile memory device of FIG. 15 may have a structure in which a first upper chip including a first cell area CELL1, a second upper chip including a second cell area CELL2, and a lower chip including a peripheral circuit area PERI connected to each other by a bonding technique. The non-volatile memory device of FIG. 15 may be a bonding vertical NAND (BVNAND) memory device having a chip-to-chip (C2C) structure. The C2C structure may be developed by manufacturing the second upper chip including a cell region CELL2 on a first wafer, manufacturing a lower chip including a peripheral circuit region PERI on a second wafer, which is different from the first wafer, and connecting the upper chip to the lower chip by using the bonding technique. As an example, the bonding technique may refer to a method of electrically connecting a bonding metal formed on an uppermost metal layer of the second upper chip to a bonding metal formed on an uppermost metal layer of the lower chip. Likewise, the first upper chip and the second upper chip can also be bonded in the same way. The number of upper chips is not limited thereto. Hereinafter, the cell area CELL may refer to at least one of the first cell area CELL1 and the second cell area CELL2.

Each of the peripheral circuit region PERI and the cell region CELL of the memory device may include an external pad bonding area PA, a word line bonding area WLBA, and a bit line bonding area BLBA.

The peripheral circuit region PERI may include a first substrate 810, an interlayer insulating layer 815, a plurality of circuit elements 820a, 820b, and 820c formed on the first substrate 810, first metal layers 830a, 830b, and 830c respectively connected to the plurality of circuit elements 820a, 820b, and 820c, and second metal layers 840a, 840b, and 840c formed on the first metal layers 830a, 830b, and 830c. In an example embodiment, the first metal layers 830a, 830b, and 830c may be formed of tungsten having relatively high electrical resistivity, and the second metal layers 840a, 840b, and 840c may be formed of copper having relatively low electrical resistivity.

In the example embodiment illustrated in FIG. 15, although only the first metal layers 830a, 830b, and 830c and the second metal layers 840a, 840b, and 840c are shown and described, embodiments of the inventive concept are not limited thereto. For example, one or more additional metal layers may be further formed on the second metal layers 840a, 840b, and 840c. At least a portion of the one or more additional metal layers formed on the second metal layers 840a, 840b, and 840c may be formed of aluminum or another metal having a lower electrical resistivity than those of copper forming the second metal layers 840a, 840b, and 840c.

The interlayer insulating layer 815 may be disposed on the first substrate 810 and cover the plurality of circuit elements 820a, 820b, and 820c, the first metal layers 830a, 830b, and 830c, and the second metal layers 840a, 840b, and 840c. The interlayer insulating layer 815 may include an insulating material such as silicon oxide or silicon nitride.

Lower bonding metals 871b and 872b may be formed on the second metal layer 840b in the word line bonding area WLBA. In the word line bonding area WLBA, the lower bonding metals 871b and 872b in the peripheral circuit region PERI may be electrically bonded to upper bonding metals 771b and 772b of the cell region CELL. The lower bonding metals 871b and 872b and the upper bonding metals 771b and 772b may be formed of aluminum, copper, or tungsten. Further, the upper bonding metals 771b and 772b in the cell region CELL may be referred as first metal pads and the lower bonding metals 871b and 872b in the peripheral circuit region PERI may be referred as second metal pads.

The cell region CELL may include at least one memory block. The cell region CELL may include a second substrate 610 and a common source line 620. On the second substrate 610, a plurality of word lines 631 to 638 (i.e., 630) and 731 to 738 (i.e., 730) may be stacked in a direction (a Z-axis direction), perpendicular to an upper surface of the second substrate 610. At least one string select line and at least one ground select line may be arranged on and below the plurality of word lines 630 and 730, respectively, and the plurality of word lines 630 and 730 may be disposed between the at least one string select line and the at least one ground select line.

In the bit line bonding area BLBA, a channel structure CH may extend in a direction (a Z-axis direction), perpendicular to the upper surface of the second substrate 610, and pass through the plurality of word lines 630 and 730, the at least one string select line, and the at least one ground select line. The channel structure CH may include a data storage layer, a channel layer, and a buried insulating layer, and the channel layer may be electrically connected to a first metal layer 750c and a second metal layer 660c. For example, the first metal layer 750c may be a bit line contact, and the second metal layer 660c may be a bit line. In an example embodiment, the bit line 660c may extend in a first direction (a Y-axis direction), parallel to the upper surface of the second substrate 610.

In the example embodiment illustrated in FIG. 15, an area in which the channel structure CH, and the bit line 660c are disposed may be defined as the bit line bonding area BLBA. In the bit line bonding area BLBA, the bit line 660c may be electrically connected to the circuit elements 820c including a page buffer 793 in the peripheral circuit region PERI. The bit line 660c may be connected to upper bonding metals 771c, 772c, 871c and 872c in the cell region CELL, and the upper bonding metals 771c, 772c, 871c and 872c may be connected to lower bonding metals 771c, 772c, 871c and 872c connected to the circuit elements 820c of the page buffer 793.

In the word line bonding area WLBA, the plurality of word lines 630 and 730 may extend in a second direction (an X-axis direction), parallel to the upper surface of the second substrate 610 and perpendicular to the first direction, and may be connected to a plurality of cell contact plugs 641 to 647 (i.e., 640) and 741 to 747 (i.e., 740). The plurality of word lines 630 and 730 and the plurality of cell contact plugs 640 may be connected to each other in pads provided by at least a portion of the plurality of word lines 630 and 730 extending at different lengths in the second direction. A first metal layer 750b and a second metal layer 760b may be connected to an upper portion of the plurality of cell contact plugs 640 connected to the plurality of word lines 630 and 730, sequentially. The plurality of cell contact plugs 640 may be connected to the peripheral circuit region PERI by the upper bonding metals 771b and 772b of the cell region CELL and the lower bonding metals 871b and 872b of the peripheral circuit region PERI in the word line bonding area WLBA.

The plurality of cell contact plugs 640 may be electrically connected to the circuit elements 820b forming a row decoder 794 in the peripheral circuit region PERI. In an example embodiment, operating voltages of the circuit elements 820b of the row decoder 794 are different than operating voltages of the circuit elements 820c forming the page buffer 793. For example, operating voltages of the circuit elements 820c forming the page buffer 793 may be greater than operating voltages of the circuit elements 820b forming the row decoder 794.

A common source line contact plug 780 may be disposed in the external pad bonding area PA. The common source line contact plug 780 may be formed of a conductive material such as a metal, a metal compound, or polysilicon, and may be electrically connected to the common source line 620. A first metal layers 650a and 750a and a second metal layers 660a and 760a may be stacked on an upper portion of the common source line contact plug 780, sequentially. For example, an area in which the common source line contact plug 780, the first metal layers 650a and 750a, and the second metal layer 660as and 760a are disposed may be defined as the external pad bonding area PA.

Input-output pads 805 and 505 may be disposed in the external pad bonding area PA. Referring to FIG. 15, a lower insulating film 801 covering a lower surface of the first substrate 810 may be formed below the first substrate 810, and a first input-output pad 805 may be formed on the lower insulating film 801. The first input-output pad 805 may be connected to at least one of the plurality of circuit elements 820a, 820b, and 820c disposed in the peripheral circuit region PERI through a first input-output contact plug 803, and may be separated from the first substrate 810 by the lower insulating film 801. In addition, a side insulating film may be disposed between the first input-output contact plug 803 and the first substrate 810 to electrically separate the first input-output contact plug 803 and the first substrate 810.

Referring to FIG. 15, an upper insulating film 601 covering the upper surface of the second substrate 610 may be formed on the second substrate 610, and a second input-output pad 505 may be disposed on the upper insulating layer 601. The second input-output pad 505 may be connected to at least one of the plurality of circuit elements 820a, 820b, and 820c disposed in the peripheral circuit region PERI through a second input-output contact plugs 603, 604, 703, 704 and 705. In an example embodiment, the second input-output pad 505 is electrically connected to a circuit element 820a.

According to an example embodiment, the second substrate 610 and the common source line 620 are not disposed in an area in which the second input-output contact plugs 603, 604, 703, 704 and 705 is disposed. Also, the second input-output pad 505 does not overlap the word lines 630 and 730 in the third direction (the Z-axis direction). Referring to FIG. 15, the second input-output contact plugs 603, 604, 703, 704 and 705 may be separated from the second substrate 610 in a direction, parallel to the upper surface of the second substrate 610, and may pass through the interlayer insulating layers 615 and 715 of the cell region CELL to be connected to the second input-output pad 505.

According to an example embodiment, the first input-output pad 805 and the second input-output pad 505 are selectively formed. For example, the memory device may include only the first input-output pad 805 disposed on the first substrate 810 or the second input-output pad 505 disposed on the second substrate 610. Alternatively, the memory device may include both the first input-output pad 805 and the second input-output pad 505.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device may include a lower metal patterns 871a, 872a and 873a corresponding to an upper metal patterns 671a, 672a, 771a and 772a formed in an uppermost metal layer of the cell region CELL, and having the same cross-sectional shape as the upper metal patterns 671a, 672a, 771a and 772a of the cell region CELL so as to be connected to each other, in an uppermost metal layer of the peripheral circuit region PERI. In the peripheral circuit region PERI, in an embodiment, the lower metal patterns 871a, 872a and 873a formed in the uppermost metal layer of the peripheral circuit region PERI is not connected to a contact. Similarly, in the external pad bonding area PA, an upper metal patterns 671a, 672a, 771a and 772a, corresponding to the lower metal patterns 871a, 872a and 873a formed in an uppermost metal layer of the peripheral circuit region PERI, and having the same shape as a lower metal patterns 871a, 872a and 873a of the peripheral circuit region PERI, may be formed in an uppermost metal layer of the cell region CELL.

The lower bonding metals 871b and 872b may be formed on the second metal layer 840b in the word line bonding area WLBA. In the word line bonding area WLBA, the lower bonding metals 871b and 872b of the peripheral circuit region PERI may be electrically connected to the upper bonding metals 771b and 772b of the cell region CELL by a Cu-to-Cu bonding.

Further, in the bit line bonding area BLBA, an upper metal pattern 892, corresponding to a lower metal pattern 852 formed in the uppermost metal layer of the peripheral circuit region PERI, and having the same cross-sectional shape as the lower metal pattern 852 of the peripheral circuit region PERI, may be formed in an uppermost metal layer of the cell region CELL. In an embodiment, a contact is not formed on the upper metal pattern 892 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. In an embodiment, a contact is not formed on the reinforcement metal pattern.

In a bit line bonding area BLBA, the cell area CELL may include a lower channel LCH and an upper channel UCH that are connected to each other. The lower channel LCH and the upper channel UCH may be connected to each other to form one channel structure CH. The channel structure CH of FIG. 15 may be provided through a process for the lower channel LCH and a process for the upper channel UCH. In the first cell area CELL, the lower channel LCH may extend in a direction perpendicular to an upper surface of a third substrate 610 and penetrate through a common source line 620 and lower word lines 631 to 634. The lower channel LCH may include a data storage layer, a channel layer, and a buried insulation layer and may be connected to the upper channel UCH. The upper channel UCH may penetrate through upper word lines 635 to 638. The upper channel UCH may include a data storage layer, a channel layer, and a buried insulation layer, and the channel layer of the upper channel UCH may be electrically connected to a first metal layer 650c and a second metal layer 660c. As a channel length increases, it may be difficult to form a channel having a constant width due to process reasons. The memory device 120 according to an embodiment of the disclosure may include a channel having improved width uniformity through the lower channel LCH and the upper channel UCH that are formed in a sequential process.

A string select line and a ground select line may be respectively disposed on upper and lower portions of each of the word lines 630 and 730. According to an embodiment of the disclosure, a word line adjacent to the string select line or a word line adjacent to the ground select line may be dummy word lines. In the memory device 120 according to an embodiment, a word line located near a boundary of the lower channel LCH and the upper channel UCH may be a dummy word line. For example, the word line 634 and the word line 635 that form the boundary of the lower channel LCH and the upper channel UCH may be center dummy lines.

As described above with reference to FIGS. 9 to 12, by applying the center dummy voltage VCD or the ground voltage GND to the center dummy line, a switching operation of a transistor connected to the center dummy line may be controlled. By controlling the word lines of the non-select stack not to be involved in channel boosting during a program operation through the center dummy line, boosting efficiency may be increased, and pass voltage disturbance may be reduced.

In the bit line bonding area BLBA, the first cell area CELL1 may include a first through electrode THV1, and the second cell area CELL2 may include a second through electrode THV2. The first through electrode THV1 may penetrate through the common source line 620 and the plurality of word lines 630. The first through electrode THV1 may further penetrate through the third substrate 610. The first through electrode THV1 may include a conductive material. Alternatively, the first through electrode THV1 may include a conductive material surrounded by an insulating material. The second through electrode THV2 may be the same as the first through electrode THV1. The first through electrode THV1 and the second through electrode THV2 may be electrically connected to each other by a first through upper metal pattern 672b and a second through lower metal pattern 771d. The first through upper metal pattern 672b may be formed at an upper end of a first upper chip including the first cell area CELL1, and the second through lower metal pattern 771d may be formed at a lower end of a second upper chip including the second cell area CELL2. The first through electrode THV1 may be electrically connected to the first metal layer 650c and the second metal layer 660c. A first through via 671b may be provided between the second metal layer 660c and the first through upper metal pattern 672b, and a second through via 772d may be provided between the second through electrode THV2 and the second through lower metal pattern 771d. The first through upper metal pattern 672b and the second through lower metal pattern 771d may be connected to each other by a bonding method.

According to an embodiment of the disclosure, a first upper metal pattern 672a may be provided at an upper end of the first cell area CELL1, and a first lower metal pattern 771e may be provided at a lower end of the second cell area CELL2. The first upper metal pattern 672a of the first cell area CELL1 and the first lower metal pattern 771e of the second cell area CELL2 may be connected to each other by the bonding method in an external pad bonding area PA. A second upper metal pattern 772a may be provided at an upper end of the second cell area CELL2, and a second lower metal pattern 873a may be provided at a lower end of the peripheral circuit area PERI. The second upper metal pattern 772a of the second cell area CELL2 and the second lower metal pattern 873a of the peripheral circuit area PERI may be connected to each other in the external pad bonding area PA by the bonding method.

As disclosed herein, the performance of the flash memory may be improved by using the dummy word line to function similarly to an SSL. The dummy word line may function similar to SSL by turning on a select cell string connected to a program enable bit line and turning off a select cell string and a non-select cell string connected to a program prohibit bit line. By controlling an electrical connection of a transistor connected to the dummy word line, a stack to be programmed and a stack not to be programmed may be disconnected from each other. Because word lines of the stack not to be programmed do not participate in channel boosting since the electrical connection between the stacks is released, a constant voltage level may be maintained while a program loop is in progress. In addition, a length of a boosted channel is decreases to enable localized boosting, thereby increasing boosting efficiency.

As described above, embodiments are disclosed in the drawings and the specification. Although embodiments have been described using specific terms in the present specification, these are only used for the purpose of explaining the technical spirit of the disclosure and not used to limit the meaning or the scope of the disclosure described in the claims. Therefore, it will be understood by those of ordinary skill in the art that various modifications and equivalent other embodiments are possible therefrom. Accordingly, the true technical protection scope of the disclosure should be defined by the technical spirit of the appended claims.

At least one of the components, elements, modules or units (collectively "components" in this paragraph) represented by a block in the drawings such as FIGS. 2-3, may be embodied as various numbers of hardware, software and/or firmware structures that execute respective functions described above. At least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

While the disclosure has been particularly shown and described with reference to embodiments thereof, it will be understood that various changes in form and details may be made therein without departing from the spirit and scope of the following claims.

What is claimed is:

1. An operating method of a non-volatile memory device that comprises a plurality of cell strings each comprising a first stack and a second stack adjacent to the first stack, the operating method comprising:
performing a first program operation during a time period in which a plurality of program loops are performed, by applying a program voltage comprising a first plurality of voltage levels to a select word line connected to the first stack of each of the plurality of cell strings, each program loop of the plurality of program loops comprising a bit line setup period and a program execution period;
applying, during the time period, second voltages comprising a second plurality of voltage levels to a non-select word line connected to the first stack of each of the plurality of cell strings; and
maintaining, during the time period, a third voltage at a first level, the third voltage applied to a non-select word line connected to the second stack of each of the plurality of cell strings, such that the third voltage applied to the non-select word line connected to the second stack of each of the plurality of cell strings is maintained at the first level over multiple bit line setup periods and multiple program execution periods of the plurality of program loops.

2. The operating method of claim 1, wherein the first level comprises a pass voltage level or a read voltage level.

3. The operating method of claim 1, wherein each of the plurality of program loops comprises:

a bit line setup step of applying a fourth voltage comprising a first bit line level to a program target bit line and a program prohibit bit line from among a plurality of bit lines connected to the plurality of cell strings;

a step of performing a second program operation on memory cells connected to the select word line; and a step of performing a verification operation on the memory cells connected to the select word line.

4. The operating method of claim 1, further comprising, while the program voltage is applied to the select word line in the plurality of program loops, applying a first dummy voltage to a word line connected to a plurality of transistors adjacent to a boundary between the first stack and the second stack.

5. The operating method of claim 1, further comprising initializing a word line voltage of the plurality of cell strings.

6. An operating method of a non-volatile memory device comprising a plurality of cell strings connected to a plurality of bit lines, wherein the plurality of cell strings comprise a plurality of string select transistors respectively connected to the plurality of bit lines, the operating method comprising:

applying a first voltage comprising a first level to a first bit line and a second bit line from among the plurality of bit lines during a first time period, wherein the first bit line and the second bit line are respectively connected to a first cell string and a second cell string from among the plurality of cell strings;

applying a second voltage comprising a second level to the first bit line during a second time period subsequent to the first time period;

turning on first string select transistors, from among the plurality of string select transistors, included in a cell string connected to the first bit line during the second time period;

turning off second string select transistors, from among the plurality of string select transistors, included in a cell string connected to the second bit line during the second time period; and maintaining a third voltage applied to the second bit line at the first level during the second time period by electrically disconnecting a channel of a second select stack included in the second cell string and the second bit line from each other by applying a first dummy voltage to at least one second transistor adjacent to a boundary between a stack adjacent to the second select stack and the second select stack.

7. The operating method of claim 6, wherein each of the first cell string and the second cell string comprises a plurality of stacks comprising a select stack connected to a select word line, and wherein the applying of the second voltage comprising the second level to the first bit line comprises electrically connecting a channel of a first select stack included in the first cell string and the first bit line to each other by applying the first dummy voltage to at least one first transistor adjacent to a boundary of a stack adjacent to the first select stack and the first select stack.

8. The operating method of claim 7, wherein a fourth level voltage comprises a first value obtained by adding a threshold voltage of the at least one first transistor and a second value of the second voltage to each other, and the first dummy voltage comprises a voltage level between the threshold voltage and the fourth level voltage.

9. The operating method of claim 7, further comprising applying a pass voltage to a word line connected to the stack adjacent to the first select stack during the first time period and the second time period.

10. The operating method of claim 7, wherein the at least one first transistor comprises a first transistor included in the first select stack and a second transistor included in the stack adjacent to the first select stack, and wherein the electrically connecting of the channel of the first select stack and the first bit line to each other comprises applying the first dummy voltage to a first dummy line connected to the first transistor and a second dummy line connected to the second transistor.

11. The operating method of claim 7, wherein the at least one first transistor comprises a first transistor included in the first select stack and a second transistor included in the stack adjacent to the first select stack, and wherein the electrically connecting of the channel of the first select stack and the first bit line to each other comprises:

applying the first dummy voltage to a dummy line connected to the first transistor; and applying a third dummy voltage to a dummy line connected to the second transistor.

12. The operating method of claim 6, further comprising applying a bit line precharge voltage to the first bit line and the second bit line before the first time period.

13. The operating method of claim 12, wherein the applying of the first voltage comprises:

electrically disconnecting a channel of a third select stack included in a third cell string and the first bit line from each other by applying a second dummy voltage to a third transistor adjacent to a boundary between a stack adjacent to the third select stack and the third select stack; and electrically disconnecting a channel of a fourth select stack included in a fourth cell string and the second bit line from each other by applying the second dummy voltage to a fourth transistor adjacent to a boundary between a stack adjacent to the fourth select stack and the fourth select stack.

14. The operating method of claim 13, further comprising:

applying a third dummy voltage to the third transistor adjacent to the boundary of the stack adjacent to the third select stack and the third select stack during the second time period; and applying a fourth dummy voltage to the fourth transistor adjacent to the boundary of the stack adjacent to the fourth select stack and the fourth select stack during the second time period.

15. The operating method of claim 6, wherein each of the first cell string and the second cell string comprises a plurality of stacks comprising a select stack connected to a select word line, wherein the operating method further comprises electrically disconnecting a channel of a first select stack included in the first cell string and the first bit line from each other by applying a fifth dummy voltage to a fifth transistor adjacent to a boundary between a stack adjacent to the first select stack and the first select stack during the first time period and the second time period, and wherein the first select stack comprises a stack connected to the first bit line from among the plurality of stacks.

16. The operating method of claim 15, wherein the fifth dummy voltage comprises a ground voltage.

17. The operating method of claim 6, further comprising initializing a word line voltage of the plurality of cell strings.

18. A non-volatile memory device comprising:
a memory cell array comprising a plurality of cell strings;
a voltage generator configured to generate a voltage applied to a bit line connected to the plurality of cell strings; and
a control circuit configured to program data received from the outside to the memory cell array,
wherein the control circuit is further configured to:
control an electrical connection between a select stack comprising a select word line and a stack adjacent to the select stack by:
controlling at least one transistor adjacent to a boundary between the select stack and the stack adjacent to the select stack, and
controlling a voltage applied to a non-select word line connected to the stack adjacent to the select stack to maintain a first level during a time period in which a plurality of program loops for the memory cell array are performed, such that the voltage applied to the non-select word line connected to the stack adjacent to the select stack is maintained at the first level over multiple bit line setup periods and multiple program execution periods of the plurality of program loops.

19. The non-volatile memory device of claim 18, wherein the control circuit is further configured to, after controlling a voltage having a second level to be applied to a first bit line and a second bit line during a bit line setup operation:
applying a voltage having a third level to the first bit line, and
applying a voltage having the second level to the second bit line.

* * * * *